(12) United States Patent
Muhowski et al.

(10) Patent No.: US 10,879,420 B2
(45) Date of Patent: Dec. 29, 2020

(54) CASCADED SUPERLATTICE LED SYSTEM

(71) Applicant: UNIVERSITY OF IOWA RESEARCH FOUNDATION, Iowa City, IA (US)

(72) Inventors: Aaron Muhowski, Iowa City, IA (US); Cassandra Bogh, Iowa City, IA (US); John Prineas, Iowa City, IA (US); Jon Olesberg, Iowa City, IA (US)

(73) Assignee: University of Iowa Research Foundation, Iowa City, IA (US)

( * ) Notice: Subject to any disclaimer, the term of this patent is extended or adjusted under 35 U.S.C. 154(b) by 0 days.

(21) Appl. No.: 16/504,493

(22) Filed: Jul. 8, 2019

(65) Prior Publication Data

US 2020/0013923 A1    Jan. 9, 2020

Related U.S. Application Data

(60) Provisional application No. 62/695,680, filed on Jul. 9, 2018.

(51) Int. Cl.
*H01L 33/06*        (2010.01)
*H01L 33/14*        (2010.01)
(Continued)

(52) U.S. Cl.
CPC .......... *H01L 33/06* (2013.01); *H01L 33/145* (2013.01); *H01L 33/24* (2013.01); *H01L 33/30* (2013.01); *H01L 33/54* (2013.01); *H01L 33/642* (2013.01)

(58) Field of Classification Search
None
See application file for complete search history.

(56) References Cited

U.S. PATENT DOCUMENTS 6,281,518 B1    8/2001  Sato
6,320,212 B1    11/2001 Chow
(Continued)

FOREIGN PATENT DOCUMENTS

CN    102037577 B    4/2011
CN    106684200 B    2/2018
(Continued)

OTHER PUBLICATIONS

International Search Report and Written Opinion dated Dec. 18, 2019 in corresponding International Application No. PCT/IB2019/055845.

(Continued)

*Primary Examiner* — Alexander G Ghyka
(74) *Attorney, Agent, or Firm* — Miles & Stockbridge P.C.; Ajay A. Jagtiani

(57) ABSTRACT

In embodiments described herein, a light emitting diode device comprises an emission device with an emission region and a bottom contact layer. The emission region comprises n cascading emission layers, where n is a whole and positive number. The n cascading emission layers comprise at least one superlattice structure. In an embodiment, a tunnel junction is spaced between a first superlattice structure and a second superlattice structure. In an embodiment, light extraction is enhanced with a trapezoidal shaped chip, a roughened exit interface, and encapsulation of the chip with a hemispherical shaped polymer. In an embodiment, the superlattice structure may be repeated periods of InAs/AlGaInSb. In another embodiment, the superlattice may be repeated periods of InAs/GaInSb/InAs/AlAsSb. In another embodiment, between the bottom contact layer and the emission region is a tunnel junction where the bottom contact layer and the tunnel junction form an n-type anode layer.

54 Claims, 20 Drawing Sheets

(51) Int. Cl.
*H01L 33/64* (2010.01)
*H01L 33/30* (2010.01)
*H01L 33/54* (2010.01)
*H01L 33/24* (2010.01)

(56) References Cited

U.S. PATENT DOCUMENTS

| | | | |
|---|---|---|---|
| 6,404,791 B1 | 6/2002 | Yang | |
| 6,407,407 B1 | 6/2002 | Johnson et al. | |
| 6,441,393 B2 | 8/2002 | Goetz et al. | |
| 6,813,296 B2 | 11/2004 | Goyal et al. | |
| 6,987,613 B2 | 1/2006 | Pocius et al. | |
| 7,053,419 B1 | 5/2006 | Camras et al. | |
| 7,141,829 B2 | 11/2006 | Takahashi | |
| 7,256,483 B2 | 8/2007 | Epler et al. | |
| 7,329,894 B2 | 2/2008 | Kitatani et al. | |
| 7,583,715 B2 | 9/2009 | Hill et al. | |
| 7,791,091 B2 | 9/2010 | Nagai | |
| 7,822,089 B2 | 10/2010 | Eichler et al. | |
| 7,932,534 B2 | 4/2011 | Singh et al. | |
| 7,989,323 B2 | 8/2011 | Shenai-Khatkhate | |
| 8,008,646 B2 | 8/2011 | Leem | |
| 8,089,081 B2 | 1/2012 | Kitagawa et al. | |
| 8,101,964 B2 | 1/2012 | Kitagawa et al. | |
| 8,138,516 B2 | 3/2012 | Unno | |
| 8,367,450 B2 | 2/2013 | Bahir et al. | |
| 8,455,282 B2 | 6/2013 | Kim et al. | |
| 8,471,240 B2 | 6/2013 | Eichler et al. | |
| 8,536,602 B2 | 9/2013 | Kim et al. | |
| 8,586,963 B2 | 11/2013 | Tansu et al. | |
| 8,664,679 B2 | 3/2014 | Yan et al. | |
| 8,928,022 B2 | 1/2015 | Kuo et al. | |
| 8,929,417 B2 | 1/2015 | Yang et al. | |
| 8,963,121 B2 | 2/2015 | Odnoblyudov et al. | |
| 8,988,134 B2 | 3/2015 | Schieke et al. | |
| 8,993,993 B2 | 3/2015 | Ko et al. | |
| 9,099,842 B2 | 4/2015 | Cerutti et al. | |
| 9,024,331 B2 | 5/2015 | Sakano | |
| 9,276,159 B2 | 1/2016 | Evans et al. | |
| 9,281,427 B2 | 3/2016 | Kyono et al. | |
| 9,324,900 B2 | 4/2016 | Evans et al. | |
| 9,324,910 B2 | 4/2016 | Wu et al. | |
| 9,337,366 B2 | 5/2016 | Xu et al. | |
| 9,401,453 B2 | 7/2016 | Choi | |
| 9,425,351 B2 | 8/2016 | Ma et al. | |
| 9,472,627 B2 | 10/2016 | Vizbaras et al. | |
| 9,490,455 B2 | 11/2016 | Fogel et al. | |
| 9,509,123 B2 | 11/2016 | Belkin et al. | |
| 9,583,687 B2 | 2/2017 | Hwang | |
| 9,601,672 B2 | 3/2017 | Ouderkirk et al. | |
| 9,605,000 B2 | 3/2017 | Kasai et al. | |
| 9,608,148 B2 | 3/2017 | Kyono et al. | |
| 9,634,186 B2 | 4/2017 | Lee | |
| 9,680,074 B2 | 6/2017 | Yun et al. | |
| 9,711,679 B2 | 7/2017 | Miller | |
| 9,768,357 B2 | 9/2017 | Gaska et al. | |
| 9,780,268 B2 | 10/2017 | Hussell et al. | |
| 9,799,798 B1 | 10/2017 | Luk | |
| 9,887,310 B2 | 2/2018 | Akita et al. | |
| 9,947,827 B2 | 4/2018 | Miller | |
| 2007/0122994 A1 | 5/2007 | Sonobe et al. | |
| 2013/0121359 A1 | 5/2013 | Mansour et al. | |
| 2013/0182736 A1* | 7/2013 | Hashimoto | H01S 5/343 372/45.012 |
| 2013/0252361 A1* | 9/2013 | Li | H01S 5/24 438/42 |
| 2015/0115221 A1* | 4/2015 | Nagel | H01L 31/02327 257/13 |
| 2016/0035931 A1 | 2/2016 | Zhurtanov et al. | |
| 2016/0149075 A1 | 5/2016 | Atanackovic | |
| 2016/0211393 A1 | 7/2016 | Lumb et al. | |
| 2016/0240758 A1 | 8/2016 | Huang et al. | |
| 2016/0308093 A1* | 10/2016 | Miller | H01L 33/14 |
| 2017/0125979 A1 | 4/2017 | Yang et al. | |
| 2017/0162747 A1 | 6/2017 | Aoyagi et al. | |
| 2017/0358613 A1 | 12/2017 | Okumura et al. | |
| 2017/0373206 A1 | 12/2017 | Knorr, Jr. et al. | |
| 2018/0000643 A1 | 1/2018 | Scheller et al. | |
| 2018/0083165 A1 | 3/2018 | Lim et al. | |
| 2018/0122978 A1 | 3/2018 | Khatibzadeh et al. | |
| 2019/0371964 A1* | 12/2019 | Bour | H01L 33/0008 |
| 2020/0006592 A1* | 1/2020 | Prineas | H01L 33/36 |
| 2020/0161502 A1* | 5/2020 | Deliwala | H01L 33/58 |

FOREIGN PATENT DOCUMENTS

| | | |
|---|---|---|
| CN | 106711249 B | 4/2018 |
| CN | 106784117 B | 4/2018 |
| EP | 1398839 B1 | 3/2012 |
| WO | 2015138635 A1 | 9/2015 |
| WO | 2018042534 A1 | 8/2018 |

OTHER PUBLICATIONS

A.J. Muhowski et al., n-type anode layer, high-power MWIR superlattice LED, Applied Physics Letters vol. 111, No. 24, 243509, 2017.
S.A. Anson et al., Differential gain, differential index, and linewidth enhancement factor for a 4 μm superlattice laser active layer, Journal of Applied Physics, vol. 86, No. 2, pp. 713-718, Jul. 15, 1999.
A. Vogt et al., Ohmic contact formation mechanism of the PdGeAu system on n-type GaSb grown by molecular beam epitaxy, Journal of Applied Physics, vol. 83, No. 12, pp. 7715-7719, Jun. 15, 1998.
R.K. Huang et al., Ohmic Contacts to n-Type GaSb and n-Type GaInAsSb, Journal of Electronic Materials, vol. 22, No. 11, pp. 1407-1410, 2004.
B.V. Olson et al., Time-resolved optical measurements of minority carrier recombination in a mid-wave infrared InAsSb alloy and InAs/InAsSb superlattice, Applied Physics Letter, vol. 101, 092109-1-4, 2012.
C.H. Grein et al., Minority carrier lifetimes in ideal InGaSb/InAs superlattices, Applied Physics Letter, vol. 61, pp. 2905-2907, Dec. 14, 1992.
D. Donetsky et al., Carrier lifetime measurements in short-period InAs/Ga Sb strained-layer superlattice structures, Applied Physics Letter, vol. 95, 212104, 2009.
D. Hoffman et al., Electroluminescence of InAs—GaSb Heterodiodes, IEEE Journal of Quantum Electronics, vol. 42, No. 2, Feb. 2006, pp. 126-130.
D.L. Smith et al., Proposal for strained type II superlattice infrared detectors, Journal Appl. Physics, vol. 62 (6), Sep. 15, 1987, pp. 2545-2548.
S. Jung et al., Dual wavelength GaSb based type I quantum well mid-infrared light emitting diodes, Applied Physics Letters, vol. 96, pp. 191102-1-191102-3, 2010.
E.J. Koerperick et al., InAs/GaSb cascaded active region superlattice light emitting diodes for operation at 3.8 um, Applied Physics Letters, vol. 92, pp. 121106-1-112106-3, 2008.
G.A. Sai-Halasz et al., A new semiconductor superlattice, Applied Physics Letters, vol. 30, pp. 651-653, Jun. 15, 1977.
E.J. Koerperick et al., Active Region Cascading for Improved Performance in InAs—GaSb Superlattice LEDs, IEEE Journal of Quantum Electronics, vol. 44, No. 12, pp. 1242-1247, Dec. 2008.
E.J. Koerperick et al., Cascaded Superlattice InAs/GaSb Light-Emitting Diodes for Operation in the Long-Wave Infrared, IEEE Journal of Quantum Electronics, vol. 47, No. 1, pp. 50-54, Jan. 2011.
J.P. Prineas et al., Cascaded active regions in 2.4 um GaInAsSb light-emitting diodes for improved current efficiency, Applied Physics Letters, vol. 89, pp. 211108-1-211108-3, 2006.
D. Shen et al., Enhanced thermal conductivity of epoxy composites filled with silicon carbide nanowires, Scientific Reports vol. 7, pp. 1-11, 2017.
D. Sun et al., Red and infrared side by side semiconductor quantum well lasers integrated on a GaAs substrate, Applied Physics, Letters vol. 73, 1998.

* cited by examiner

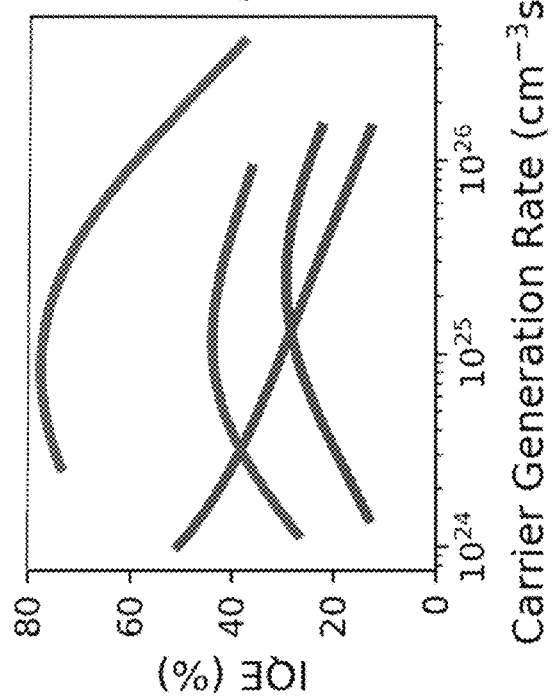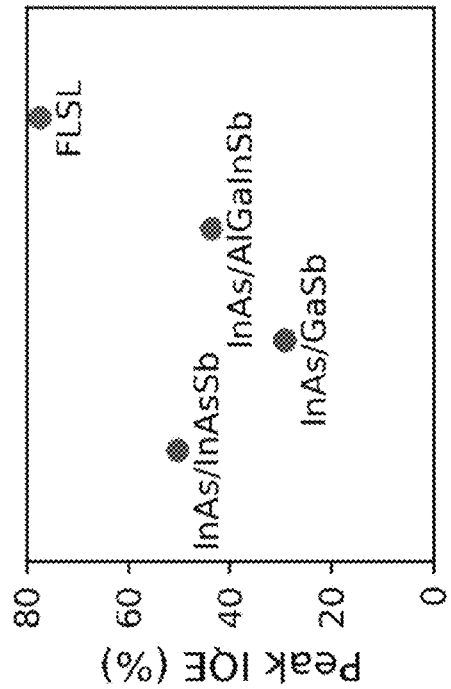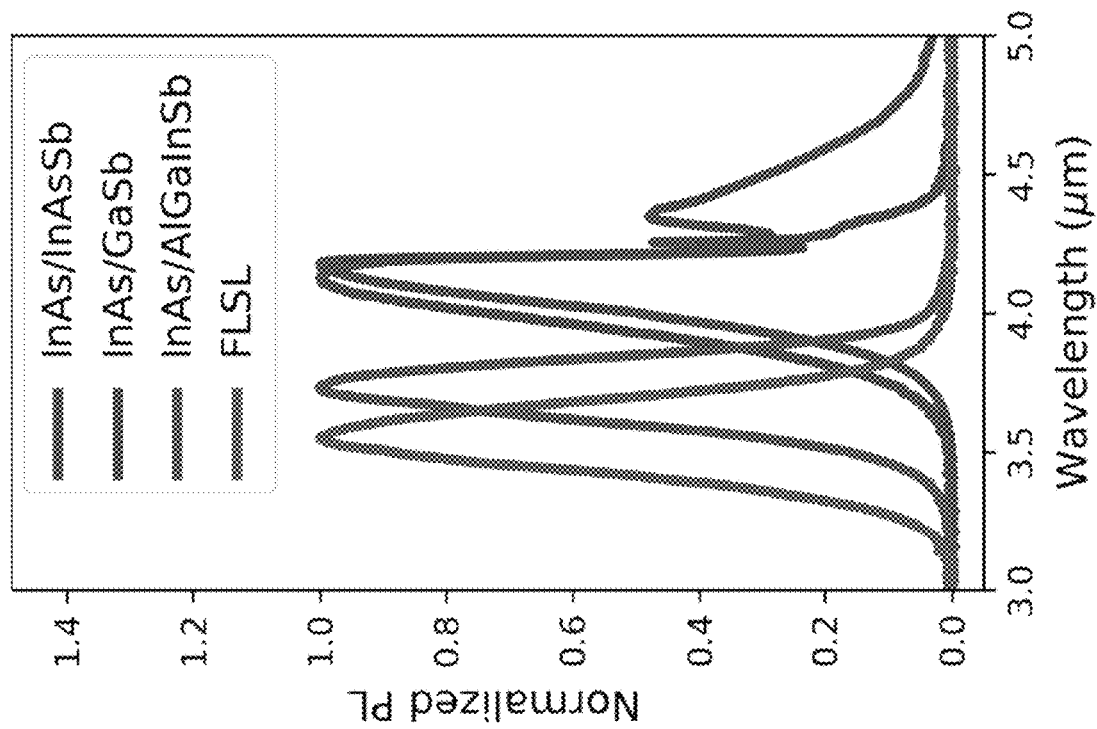
FIG. 17A
FIG. 17B
FIG. 17C $$\eta_{wallplug} = \eta_{extraction}\,\eta_{internal\ quantum\ efficiency}\,\eta_{ohmic}\,\eta_{quantum\ defect}$$

CASCADED SUPERLATTICE LED SYSTEM

CROSS-REFERENCE TO RELATED APPLICATIONS

This application claims benefit of priority of U.S. Provisional Patent Application No. 62/695,680 filed Jul. 9, 2018. The entire contents and disclosures of this patent application is incorporated herein by reference in its entirety.

BACKGROUND

Field of the Invention

Embodiments herein include light emitting diode systems and devices.

Background of the Invention

Some superlattice structures associated with light emitting diode (LED) systems are limited in the lower injection regime by Shockley-Read-Hall (SRH) recombination, and in the higher injection regime by Auger recombination. Commercial mid-ir led devices use quaternary materials such as GaInAsSb. Other mid-ir LEDs either use superlattices (e.g., InAs/InAsSb or InAs/GaSb) or W-quantum wells. All of these materials are limited by SRH at low injection or Auger at high injection, but to varying degrees. In general, GaInAsSb or InAs/InAsSb have fairly low SRH rate, but high Auger rate. This makes them attractive for detectors, but unattractive for LEDs. Both W-quantum wells and InAs/GaSb use bandstructure engineering to suppress Auger, with varying degrees of success. Auger recombination leads to inefficient LEDs. In addition, high SRH recombination rates limit the performance of photodiode detectors.

SUMMARY

According to first broad aspect, the present disclosure provides a device, comprising: an emission device comprising: a top electrical contact; a top contact layer; a bottom injection layer; a bottom electrical contact; and an emission region disposed between the top contact layer and the bottom injection layer, wherein the emission region is configured with a first bandgap to emit light of a first wavelength, wherein the emission region comprises n cascading emission layers, where n is a whole and positive number, wherein the n cascading emission layers comprise at least one superlattice structure positioned between the bottom and top injection layers, wherein the internal quantum efficiency (IQE) of the emission region is 15% or above, measured at 77 K; and an encapsulant disposed over the emission device.

According to a second broad aspect, the present disclosure provides a device, comprising: an emission device; and a bottom injection layer comprising an n-type anode layer, wherein the emission device comprises a top and bottom electrical contact, a top and bottom injection layer, and an emission region disposed between the top and bottom injection layers, wherein the emission region comprises n cascading emission layers, wherein the n cascading emission layers are comprised of n−1 repeats of a first superlattice structure and a tunnel junction, followed by a final (nth) superlattice structure, wherein the emission region is configured with a first bandgap to emit radiation of a first wavelength, wherein the internal quantum efficiency (IQE) of the emission region is 15% or above, measured at 77 K.

According to a second broad aspect, the present disclosure provides a device, comprising: an emission device, wherein the emission device comprises a top and bottom electrical contact, a top and bottom injection layer, and an emission region disposed between the top and bottom injection layers, wherein the emission region comprises n cascading emission layers, where n is a whole and positive number, wherein the n cascading emission layers comprise at least one superlattice structure, wherein the internal quantum efficiency (IQE) of the emission region is 15% or above.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

FIGS. 17A to 17C illustrate measurement/testing results comparing four different superlattice structure embodiments according to one embodiment of the present disclosure.

DETAILED DESCRIPTION OF THE INVENTION

Definitions

Figure 1:
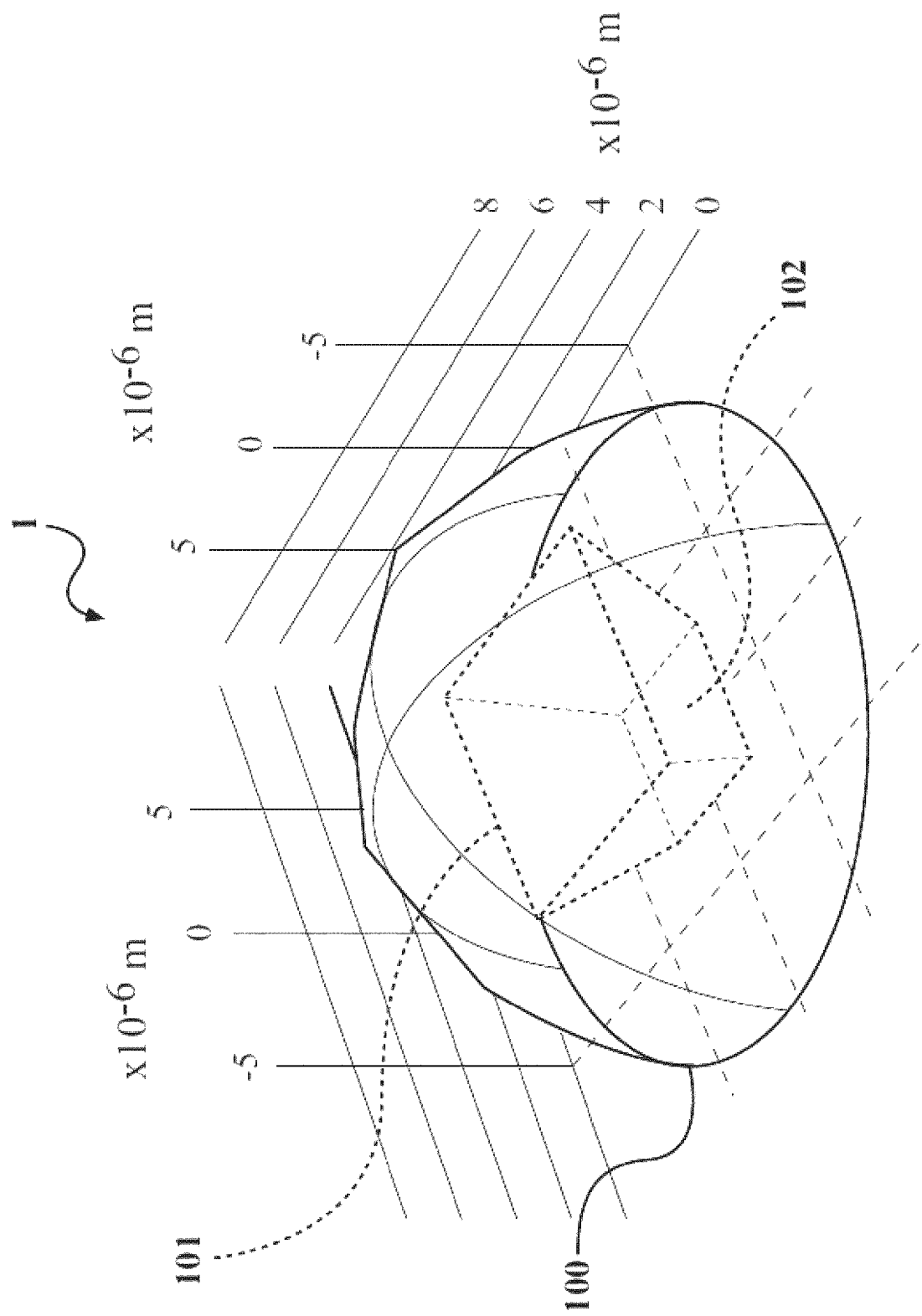
FIG. 1 illustrates a perspective view of a light emitting diode device according to one embodiment of the present disclosure.

Where the definition of terms departs from the commonly used meaning of the term, applicant intends to utilize the definitions provided below, unless specifically indicated.

It is to be understood that the foregoing general description and the following detailed description are exemplary and explanatory only and are not restrictive of any subject matter claimed. In this application, the use of the singular includes the plural unless specifically stated otherwise. It must be noted that, as used in the specification and the appended claims, the singular forms "a," "an" and "the" include plural referents unless the context clearly dictates otherwise. In this application, the use of "or" means "and/or" unless stated otherwise. Furthermore, use of the term "including" as well as other forms, such as "include", "includes," and "included," is not limiting.

For purposes of the present disclosure, the term "comprising", the term "having", the term "including," and variations of these words are intended to be open-ended and mean that there may be additional elements other than the listed elements.

For purposes of the present disclosure, directional terms such as "top," "bottom," "upper," "lower," "above," "below," "left," "right," "horizontal," "vertical," "up," "down," etc., are used merely for convenience in describing the various embodiments of the present disclosure. The embodiments of the present disclosure may be oriented in various ways. For example, the diagrams, apparatuses, etc., shown in the drawing FIGS. may be flipped over, rotated by 90° in any direction, reversed, etc.

For purposes of the present disclosure, a value or property is "based" on a particular value, property, the satisfaction of a condition, or other factor, if that value is derived by performing a mathematical calculation or logical decision using that value, property or other factor.

For purposes of the present disclosure, it should be noted that to provide a more concise description, some of the quantitative expressions given herein are not qualified with the term "about." It is understood that whether the term "about" is used explicitly or not, every quantity given herein is meant to refer to the actual given value, and it is also meant to refer to the approximation to such given value that would reasonably be inferred based on the ordinary skill in the art, including approximations due to the experimental and/or measurement conditions for such given value.

For the purposes of the present disclosure, the term "Auger recombination" in LEDs refers to a phenomenon wherein energy is given to a third carrier, which is excited to a higher energy level with or without moving to another energy band. After the interaction, the third carrier normally loses its excess energy to thermal vibrations. Since this process is a three-particle interaction, it is normally only significant in non-equilibrium conditions when the carrier density is very high. Auger recombination refers to a mechanism causing LED efficiency droop.

For the purposes of the present disclosure, the term "carrier density" refers to the total number of electronic carriers inside the emission layer divided by the volume of the emission layer.

For the purposes of the present disclosure, the term "carrier recombination" refers to the phenomenon wherein semiconductors are characterized by two types of mobile carriers, electrons in the conduction band and holes in the valence band. When an electron falls from the conduction band into the valence band, into a hole, a recombination process occurs and an electron hole pair disappears.

For the purposes of the present disclosure, the term "dielectric" or "dielectric material/layer" refers to an electrical insulator that can be polarized by an applied electric field. When a dielectric is placed in an electric field, electric charges do not flow through the material as they do in an electrical conductor but only slightly shift from their average equilibrium positions causing dielectric polarization. Because of dielectric polarization, positive charges are displaced in the direction of the field and negative charges shift in the opposite direction. This creates an internal electric field that reduces the overall field within the dielectric itself. If a dielectric is composed of weakly bonded molecules, those molecules not only become polarized, but also reorient so that their symmetry axes align to the field.

For the purposes of the present disclosure, the term "efficiency droop" refers to a phenomenon wherein the efficiency of LEDs decreases as the electric current increases. Heating also increases with higher currents, which compromises LED performance. These effects may put practical limits on the current through an LED in high power applications.

For the purposes of the present disclosure, the term "electroluminescence (EL)" refers to an optical phenomenon and electrical phenomenon in which a material emits light in response to the passage of an electric current or to a strong electric field. This is distinct from black body light emission resulting from heat (incandescence), from a chemical reaction (chemiluminescence), sound (sonoluminescence), or other mechanical action (mechanoluminescence).

For the purposes of the present disclosure, the term "electron well layer" refers to a layer which partially confines the electron through finite barriers on either side of the well (note the confinement is only in one direction). In a multi-layer structure through which the electron can move, the electron well layers would be layers in which the electrons would be more likely to be found.

For the purposes of the present disclosure, the term "external quantum efficiency (EQE)" refers to the ratio of the number of photons collected outside the LED to the number of charge carrier pairs (electron-hole) injected.

For the purposes of the present disclosure, the term "flip-chip bonded" refers to flipping an LED with both contacts (cathode, anode) on one side onto a fanout header, which has traces that may be connected to a power supply. LED epilayers are typically grown on a substrate. Mesas are etched into the epilayer, and contacts to the top and bottom layers of the device are made and planarized. The LED, with both contacts on one side, is flipped on to bond pads and metal traces on a fanout header. The traces can be connected to a power supply. This method allows for no wire bonds being required on the actual LED.

For the purposes of the present disclosure, the term "heterojunction" refers to the interface that occurs between two layers or regions of dissimilar crystalline semiconductors. These semiconducting materials have unequal band gaps as opposed to a homojunction. It is often advantageous to engineer the electronic energy bands in many solid-state device applications, including semiconductor lasers, solar cells and transistors ("heterotransistors") to name a few. A definition of heterojunction may also include the interface between any two solid-state materials, including crystalline and amorphous structures of metallic, insulating, fast ion conductor and semiconducting materials.

For the purposes of the present disclosure, the term "heterostructure" refers to a multi-layer structure (at least two layers) wherein more than one material is used. Typically, different layers have different bandgaps and offsets. Layers can be lattice matched, strained, or metamorphically grown.

For the purposes of the present disclosure, the term "hole well layer" refers to a layer which partially confines the hole through finite barriers on either side of the well (note the confinement is only in one direction). In a multi-layer structure through which the hole can move, the hole well layers would be layers in which the holes would be more likely to be found.

For the purposes of the present disclosure, the term "internal quantum efficiency (IQE)" refers to the ratio of the number of photons produced inside the LED to the number of charge carrier pairs (electron-hole) injected.

For the purposes of the present disclosure, the term "light-emitting diode (LED)" refers to a semiconductor light source that emits light when current flows through it. Electrons in the semiconductor recombine with holes, releasing energy in the form of photons. This effect is called electroluminescence. The color of the light (corresponding to the energy of the photons) is determined by the energy radiatively released by electrons that cross the band gap of the semiconductor. White light is obtained by using multiple semiconductors or a layer of light-emitting phosphor on the semiconductor device.

For the purposes of the present disclosure, the term "light extraction efficiency" refers to the number of photons produced inside an LED semiconductor chip to the number of photons that escape. Note the EQE=light extraction efficiency×IQE, where EQE and IQE are the external quantum efficiency and internal quantum efficiency, respectively.

For the purposes of the present disclosure, the term "peak efficiency" refers to the maximum quantum efficiency obtained over the full range of carrier generation rates (or carrier density).

For the purposes of the present disclosure, the term "light extraction efficiency" would be the number of photons that escape the LED semiconductor chip to the number of photons produced inside. Note the EQE=extraction efficiency×IQE, where EQE and IQE are the external and internal quantum efficiencies, respectively.

For the purposes of the present disclosure, the term "photodetectors" or "photodiode detectors" refer to sensors of light or other electromagnetic radiation. A photo detector has a p-n junction or semiconductor diode that converts a bandwidth of light into current.

For the purposes of the present disclosure, the term "photovoltaics (PV)" refers to the conversion of light into electricity using semiconducting materials that exhibit the photovoltaic effect.

For the purposes of the present disclosure, the term "photovoltaic effect" refers to the creation of voltage and electric current in a material upon exposure to light and is a physical and chemical phenomenon.

For the purposes of the present disclosure, the term "quantum efficiency (QE)" refers to a branching ratio between radiative decay and nonradiative (SRH, Auger) decay, and can be expressed as: Quantum Efficiency=radiative rate/(radiative rate+nonradiative rate).

For the purposes of the present disclosure, the term "radiation recombination event" refers to when an electron and a hole recombine and produce a photon (as opposed to a phonon, or heat).

For the purposes of the present disclosure, the term "semiconductor devices" refers to electronic components that exploit the electronic properties of semiconductor material, principally silicon, germanium, and gallium arsenide, as well as organic semiconductors. Semiconductor devices have replaced thermionic devices (vacuum tubes) in most applications. They use electronic conduction in the solid state as opposed to the gaseous state or thermionic emission in a high vacuum. Semiconductor devices may be manufactured both as single discrete devices and as integrated circuits (ICs), of devices manufactured and interconnected on a single semiconductor substrate, or wafer. Semiconductor material behavior can be easily manipulated by the addition of impurities, known as doping. Semiconductor conductivity can be controlled by the introduction of an electric or magnetic field, by exposure to light or heat, or by the mechanical deformation of a doped monocrystalline grid. Current conduction in a semiconductor occurs via mobile or "free" electrons and holes, collectively known as charge carriers. Doping a semiconductor such as silicon with a small proportion of an atomic impurity, such as phosphorus or boron, greatly increases the number of free electrons or holes within the semiconductor. When a doped semiconductor contains excess holes it is called "p-type," and when it contains excess free electrons it is known as "n-type," where p (positive for holes) or n (negative for electrons) is the sign of the charge of the majority mobile charge carriers. The semiconductor material used in devices is doped under highly controlled conditions in a fabrication facility, or fab, to control precisely the location and concentration of p- and n-type dopants. The junctions which form where n-type and p-type semiconductors join together are called p-n junctions. A semiconductor device works by controlling an electric current consisting of electrons or holes moving within a solid crystalline piece of semiconducting material such as silicon.

For the purposes of the present disclosure, the term "Shockley-Read-Hall Recombination" (SRH) or trap-assisted recombination refers to the phenomenon wherein an electron and hole in transition between bands are captured by a new energy state (localized state) created within the band gap by an impurity in the lattice; such energy states are called deep-level traps. The localized state can absorb differences in momentum between the carriers, and so this process is the dominant generation and recombination process in silicon and other indirect bandgap materials. It can also dominate in direct bandgap materials under conditions of very low carrier densities (very low level injection). The energy is exchanged in the form of lattice vibration, a phonon exchanging thermal energy with the material. The process is named after William Shockley, William Thornton Read and Robert N. Hall.

For the purposes of the present disclosure, the term "solid-state" materials or electronics refers to electronic devices with a physical architecture made of solid and non-moving elements and components. The compounds in a solid state device are engineered in such a way that they can switch and amplify the electric current. Solid-state electronics may include semiconductor electronics; electronic equipment using semiconductor devices such as semiconductor diodes, transistors, and integrated circuits. The term is also used for devices in which semiconductor electronics which have no moving parts replace devices with moving parts, such as the solid-state relay in which transistor switches are used in place of a moving-arm electromechanical relay, or the solid state disk (SSD), a type of semiconductor memory used in computers to replace hard disk drives, which store data on a rotating disk.

For the purposes of the present disclosure, the term "superlattice" refers to a periodic structure of two or more semiconductors with two or more distinct bandgaps. The layers form a periodic potential which results in electronic mini-bands. The layers have to be thin enough to allow carrier transport by tunneling to take place. There are several different types of superlattices, e.g., Type I, II, and III. In type I superlattices, both electrons and holes tend to be found in the same layer, and in type II superlattices the electrons and holes are in different layers. In type II superlattices with a broken gap, the conduction band of one layer sits below the hole of the other.

For the purposes of the present disclosure, the term "superluminescent diode" or "superlattice light emitting diode" (SLED or SLD) refers to an edge-emitting semiconductor light source based on superluminescence. It may combine the high power and brightness of laser diodes with the low coherence of conventional light-emitting diodes. In some embodiments, its emission band is approximately 5-700 nm wide.

For the purposes of the present disclosure, the term "tunnel junction" is a barrier, such as a thin insulating layer, a depletion region or electric potential, between two electrically conducting materials.

For the purposes of the present disclosure, the term "tunneling" or "quantum tunneling" refers to the quantum mechanical phenomenon where a subatomic particle passes through a potential barrier that it cannot surmount under the provision of classical mechanics Description While the invention is susceptible to various modifications and alternative forms, specific embodiment thereof has been shown by way of example in the drawings and will be described in detail below. It should be understood, however that it is not intended to limit the invention to the particular forms disclosed, but on the contrary, the invention is to cover all modifications, equivalents, and alternatives falling within the spirit and the scope of the invention.

As discussed, commercial mid-ir led devices use quaternary materials such as GaInAsSb. Other mid-ir LEDs either use superlattices (e.g., InAs/InAsSb or InAs/GaSb) or W-quantum wells. All of these materials are limited by SRH at low injection or Auger at high injection, but to varying degrees. A device's quantum efficiency is basically a branching ratio between radiative decay and nonradiative (SRH, Auger) decay, and can be expressed as:

$$\text{Quantum Efficiency} = \text{radiative rate}/(\text{radiative rate} + \text{nonradiative rate})$$

In general, InAsSb or InAs/InAsSb have fairly low SRH, but high Auger. This makes them attractive for detectors, but unattractive for LEDs. Both W-quantum wells and InAs/GaSb use bandstructure engineering to suppress Auger, with varying degrees of success. Auger recombination leads to inefficient LEDs. In addition, high SRH recombination rates limit the performance of photodiode detectors.

Aspects of the disclosed invention provide a design and demonstration of new superlattices (AlGaInSb/InAs; a four layer superlattice (InAs/GaInSb/InAs/AlAsSb); and improved InAs/GaSb) with superior Auger suppression and hence higher quantum efficiency at low and high current injection.

Additional aspects of the disclosed invention include an n-type anode, and geometric and material layout of the disclosed LED. The n-type anode is unique and advantageous. Conventional LED configurations may include a p-type anode and an n-type cathode. A problem with a p-type anode is that it is heavily absorbing of mid-infrared light (free carrier and intervalence absorption), which reduces extraction of light produced. A second problem with a p-type anode is that it requires a different metal than the n-type cathode to form an ohmic contact. This leads to additional fabrication steps. The n-type anode of the disclosed invention reduces absorptive loss, because it is n-type (but functions as a p-type anode with the addition of a tunnel junction).

In embodiments described and illustrated herein, a light emitting diode (LED) device comprises an emission device disposed over a heat sink, and an encapsulant disposed over the emission device and the heat sink. In an embodiment, the emission device may comprise a three-dimensional trapezoidal-pyramidal shape formed from a header contact layer, a bottom contact layer, and an emission region disposed therebetween. The emission region may be configured with a first bandgap to emit light of a first wavelength from its N cascaded emission layers separated by n−1 tunnel junctions. It should be appreciated that the trapezoidal-pyramid shape generates higher efficiencies than other shapes, e.g., cubic shapes or bare dies are considered within the scope of the teachings of the present disclosure.

In an embodiment, the n cascading emission layers may comprise at least one superlattice structure. Superlattice structures may comprise InAs electron wells and $Al_xGa_yIn_{1-x-y}Sb$ hole wells. Additionally, they may contain AlAsSb barrier layers.

Additionally, the n cascading emission layers may comprise n−1 interband tunnel junctions between two superlattice structures. The tunnel junction may comprise a thin film layer of n-AlInAsSb or n-GaInAsSb and a thin film layer of p-GaSb in some embodiments.

The LED device may further comprise a substrate with a bottom surface adjacent the bottom contact layer.

In an embodiment, an n-type anode layer may be formed from the bottom contact layer and a tunnel junction adjacent the emission region. Disclosed embodiments may employ the aforementioned n-type anode layer, for example, as described in more detail in *N-type anode layer, high-power MWIR superlattice LED* by A. J. Muhowski, R. J. Ricker, T. F. Boggess and J. P. Prineas as found in APPLIED PHYSICS LETTERS 111, 243509 (2017), which is hereby incorporated by reference.

FIG. 1 illustrates a perspective view of a light emitting diode device 1 according to an embodiment. In this embodiment, the LED device 1 comprises an encapsulant 100 formed over an emission device 101 having emission layers 102 described in more detail herein.

In some embodiments, the encapsulant 100 has dimensions that are at least twice the size as the emission device 101 in height, width, and length. Encapsulant 100 may comprise one of a variety of non-limiting physical shapes. In one disclosed embodiment, encapsulant 100 may be shaped like a hemisphere. The encapsulant 100 may be curved or, alternatively, lens-shaped. The encapsulant 100 may comprise a polymer including silicone and polydimethylsiloxane (PDMS).

In some embodiments, the encapsulant 100 is configured to be resistant to ultraviolet radiation. In other embodiments, the encapsulant 100 may be transparent to infrared radiation, have a high index of refraction, have optimized thermal conductivity, and/or maximize heat spreading with SiC nano-wires.

In some embodiments, the emission device 101 may have a thickness of about 12-600 micrometers. In some embodiments, the emission device 101 has a width that may range from a minimum of 12 micrometers to a maximum size of 500 micrometers.

Figure 2:
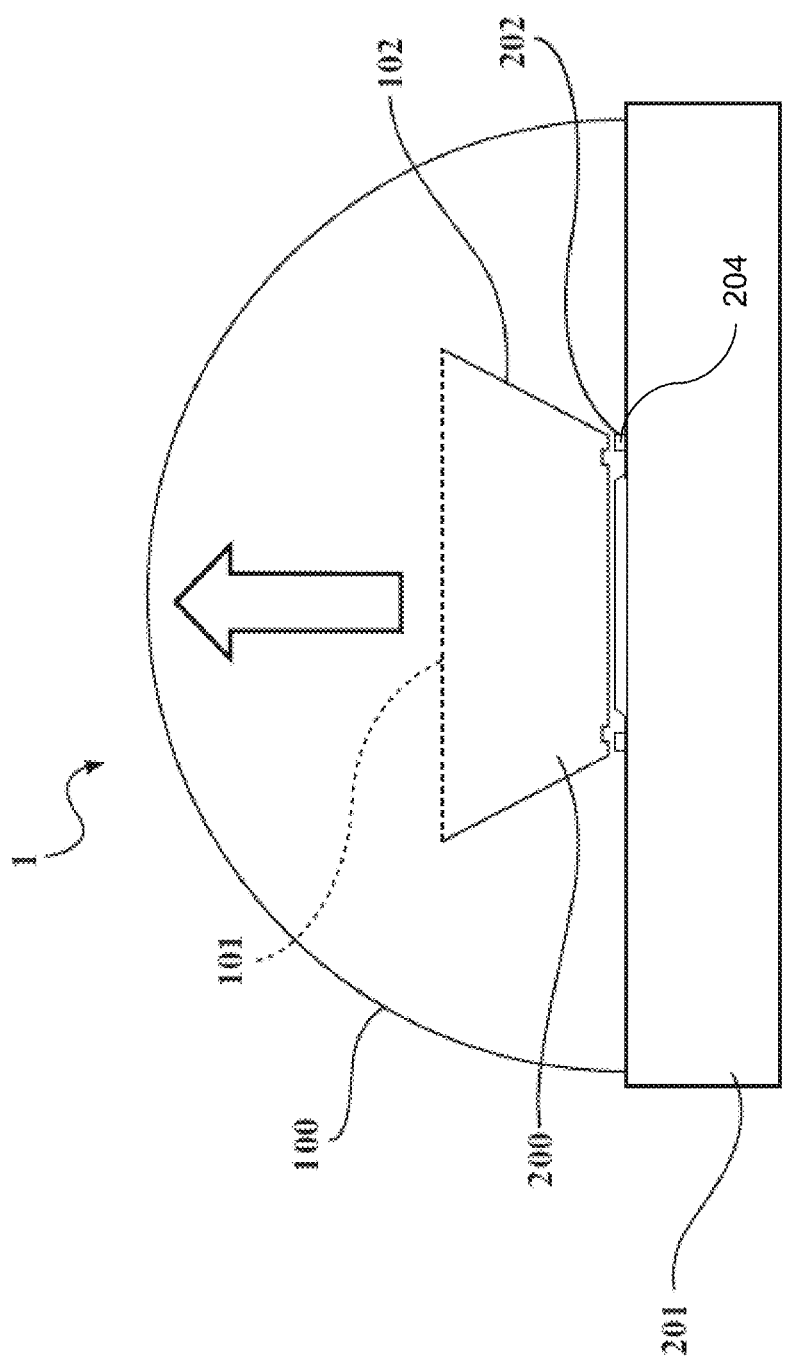
FIG. 2 illustrates a cross-sectional view of a light emitting diode device according to one embodiment of the present disclosure.

FIG. 2 illustrates a cross-sectional view of the light emitting diode device 1 according to an embodiment. In this embodiment, the superlattice light emitting diode device 1 comprises a heterostructure 200, and a heat sink 201 with metal traces 202 to activate the LED device 1. The encapsulant 100 may be positioned on a surface of heat sink 201 over the emission device 101.

The heterostructure 200 may comprise a substrate, emission layers, tunnel junctions and injection layers of the LED device 1 in some embodiments. In an embodiment, the heterostructure 200 may be shaped like a trapezoidal pyramid. However, the heterostructure 200 may alternatively be a rectangular or cubic prism. In some embodiments, the heterostructure 200 has a length along the top of the pyramid of about 500 micrometers. In some embodiments, heterostructure 200 has a width along the top of pyramid of about 500 micrometers. In some embodiments, the heterostructure 200 has a thickness (or height) of about 250 micrometers. In some embodiments, the heterostructure 200 has an angle of trapezoidal pyramid walls of about 30 degrees.

In some embodiments, the heterostructure 200 is flip-chip bonded with the heat sink 201. The resulting device is a semiconductor LED chip installed on a header circuit face-down, which may have connections formed by indium solder bumps 204 rather than metal wires. In some embodiments, the heterostructure 200 is an epitaxially-grown thin film stack configured to emit light.

The heat sink 201 comprises a dielectric layer (not shown) with metal traces 202 and indium solder bumps 204 disposed thereon. The dielectric layer may be a thin film layer. The dielectric layer may comprise SiN or $SiO_2$. The heat sink 201 may comprise Si, CuW or another element or combination of elements that have a similar coefficient of thermal expansion as GaSb. In some embodiments, the heat sink 201 is a substrate to pull heat away from the emission device 101.

Figure 3:
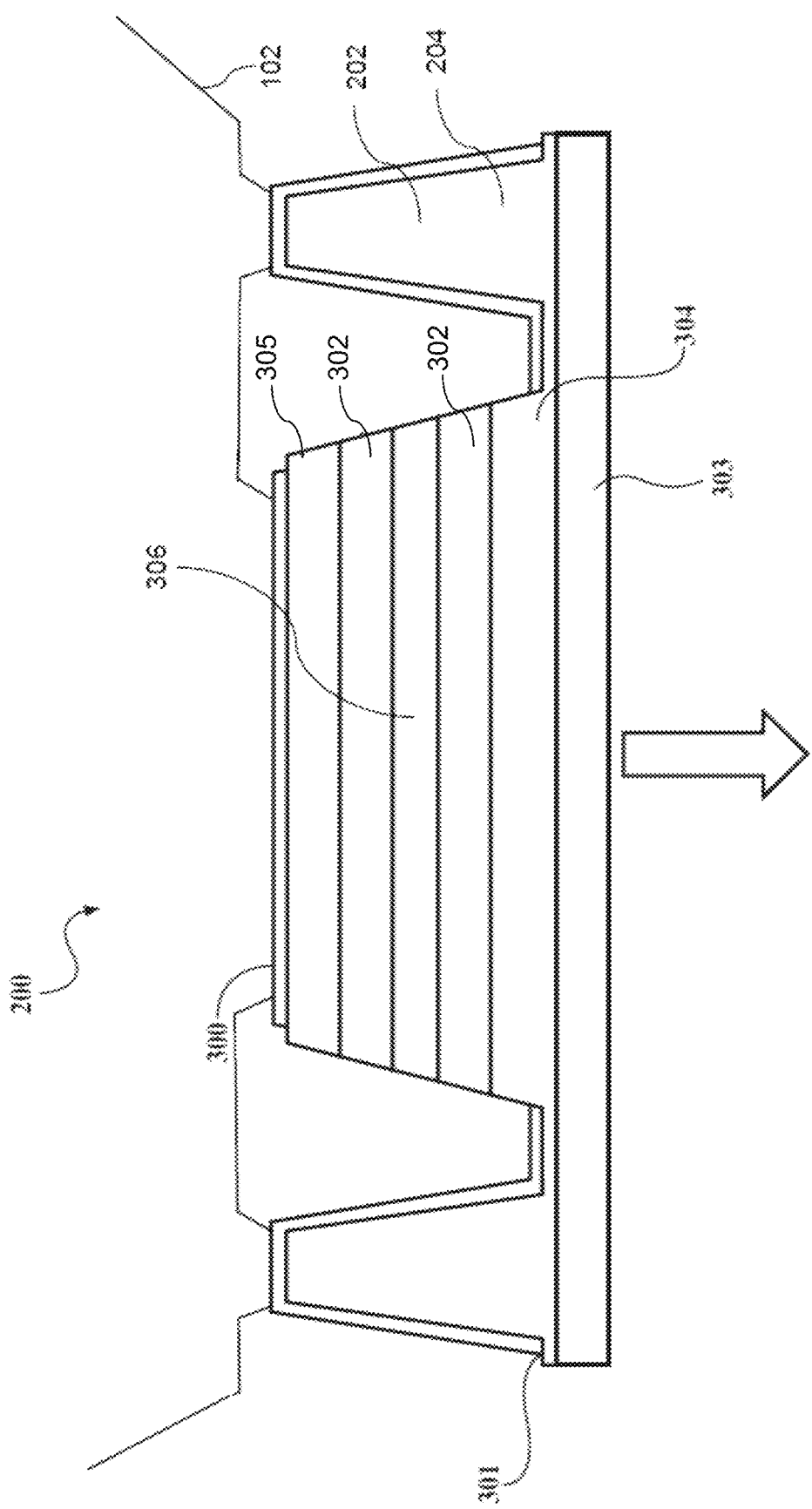
FIG. 3 illustrates a heterostructure of a light emitting diode devices according to one embodiment of the present disclosure.

FIG. 3 illustrates an exploded view of one disclosed embodiment of heterostructure 200 of a light emitting diode device 1 with metal traces 202. The heterostructure 200 may comprise a top electrical contact 300 and a bottom electrical contact 301. The heterostructure 200 may additionally comprise emission regions 302, tunnel junction 306, a substrate 303, a bottom injection layer 304 comprising, for example, an n-type layer and a tunnel junction or a p-type (n-type) layer, and/or an n-type (p-type) top injection layer 305. The top electrical contact 300 and bottom electrical contact 301 may be positioned adjacent the heat sink 201.

In an embodiment, the top electrical contact 300 and bottom electrical contact 301 comprise one or more of the following materials: Pd/Ge/Au/Pt/Au. In this embodiment, the layers of the header contact 300 may have thicknesses of about 100 to 1000 angstroms. In an embodiment, the top electrical contact 300 has layers with 100/600/300/500/1000 angstrom thicknesses, respectively. In other embodiments, the top electrical contact 300 may comprise layers of Pd/In/Pd/Pt/Au. In this embodiment, the indium may not diffuse as readily into the semiconductor as gold, and the indium may result in better reflectivity as compared with gold. In alternative embodiments, the top electrical contact 300 comprises one or more metal layers. The top electrical contact 300 may also comprise the same material used for the bottom electrical contact 301. The bottom electrical contact 301 may comprise the same material options and thickness options as the top electrical contact 300 described herein. If a p-type contact layer is used, the metal contact may include Ti/Pt/Au. It should be appreciated that to provide a good ohmic contact for contacts 300 and 301, the layers comprising these contacts 300 and 301 are preferably constructed by rapid thermal annealing.

The top electrical contact 300 may interact with the indium solder bumps 204. In some embodiments, the top electrical contact 300 is an electrical conduit to the cathode of the emission device 101. In some embodiments, the bottom electrical contact 301 functions as an electrical conduit to the anode of the emission device 101. In some embodiments, the emission region 302 has a thickness of about 500 nm. In other embodiments, the thickness may range from about 10 nm to about 2 microns. In some embodiments, the emission region 302 has an internal quantum efficiency (IQE) of optimized percentages under target operating conditions, i.e., at a current injection level appropriate to the desired optical output power for the application. IQE may aid in defining the efficiency of the LED. IQE is defined by the ratio between the electrically injected carriers and the internally emitted photons. IQE is principally affected by the LED superlattice design under high injection. This may be accomplished by bandstructure engineering, determined by the superlattice layer/material design, nonradiative Auger scattering may be suppressed, and IQE enhanced according to disclosed embodiments.

The emission region 302 may comprise thin film layer(s). In some embodiments, the emission region 302 may include thin film layers configured to emit light upon receipt of current through the heterostructure 200. The emission region 302 has been configured to have n superlattice active layers, where n can be increased until the heterostructure 200 reaches optimal electrical characteristics for light emission applications. The superlattice active layers within the emission region 302 may be separated by n−1 interband tunnel junction layers 306. The top contact layer 305 and bottom injection layer 304 may comprise an n-type layer, and an n-type layer coupled to an interband tunnel junction.

The emission region 302 may comprise InAs/GaInSb/InAs/AlAsSb, however other embodiments may comprise InAs/InAsSb, InAs/GaSb or InAs/AlGaInSb.

In some embodiments, the substrate 303 has a thickness between 12 and 650 microns. The substrate 303 may be a three-dimensional trapezoidal shape. In alternative embodiments, the substrate may be a rectangular shape. The substrate 303 comprises lightly doped n-type GaSb in some embodiments. However, in alternative embodiments, the substrate 303 may be an alternative substrate with lower optical absorption or increased thermal conductivity. The substrate 303 may be configured to have a rough surface opposite the side containing the emission layers. The directional arrow from the substrate 303 indicates the direction through which light is emitted in this embodiment. The rough surface of the substrate may be formed from chemical and/or mechanical techniques. The surface roughness may have random heights, widths, and thicknesses in the micron range. The surface roughness may have a scale of the vacuum wavelength of the emission layer over the refractive index of the substrate 303.

The bottom injection layer 304 may be formed of thin film layers. In some embodiments, the bottom injection layer 304 has a thickness of 1-3 microns. The injection layer 304 may be configured to be minimally resistive and absorptive. In some embodiments, the bottom injection layer 304 may replace the p-type anode layer. In an embodiment, the n-type anode structure includes a variably doped n-GaSb buffer layer and a variably doped tunnel junction of n-$Ga_xIn_{1-x}AsySb_{1-y}$/p-GaSb in place of a p-doped anode contact layer. In a preferred embodiment, the top contact layer is n-GaSb or n-GaInAsSb which is about 10-300 nm thick. It should be appreciated that the thickness of the top contact layer is important to prevent the metal contact atoms from diffusing into the emission layers.

In the embodiments with the n-type anode structure described previously, the top injection layer 305 comprises n-GaSb, n-GaInAsSb, or other n-doped layer. However, in embodiments without the n-type anode structure, the top injection layer 305 may comprise p-GaSb, p-GaInAsSb, or other p-doped layer and serve as the anode. In the latter case, the bottom injection layer would be n-GaSb, n-GaInAsSb, or other n-doped layer and serve as the cathode.

Figure 4:
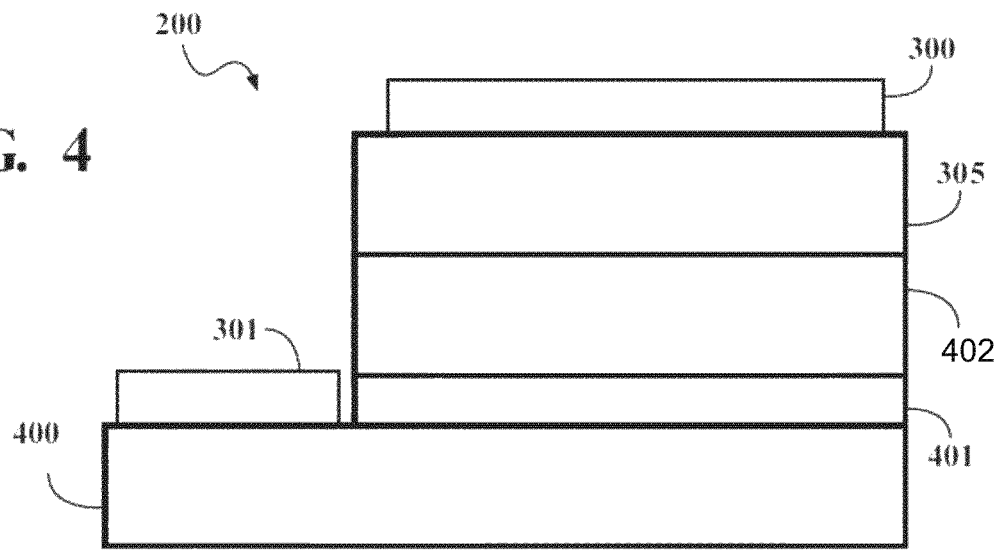
FIG. 4 illustrates a heterostructure of a light emitting diode device according to another embodiment of the present disclosure.

FIG. 4 illustrates a heterostructure 200 of a light emitting diode device 1 according to an embodiment. This embodiment has no cascading. A bottom injection layer 400 interacts with a tunnel junction layer 401 to form an n-type anode layer. In particular, the bottom injection layer 400 has been configured to replace a p-type bottom injection layer to form an n-type anode layer along with the tunnel junction layer 401. The tunnel junction layer 401 comprises an n-type hole-blocking layer and a p-type electron-blocking layer. In some embodiments, the tunnel junction layer 401 is defined as a reverse bias p-n junction layer that is composed of a hole-blocking layer deposited over an electron-blocking layer. In other embodiments, the tunnel junction layer 401 may include any of the following layers: undoped electron blocking layers with a broken band gap offset, n-doped hole-blocking layers, or p-doped electron-blocking layers.

In some embodiments, the tunnel junction layer 401 has a thickness of 30 nm but in other embodiments, the thickness of the tunnel junction layer 401 may range from a minimum of 20 nm to a maximum thickness of 60 nm.

The emission region 402 may comprise InAs/GaInSb/InAs/AlAsSb, however other embodiments may comprise InAs/InAsSb, InAs/GaSb or InAs/AlGaInSb. Spatially, the emission region 402 may be positioned between the optional tunnel junction layer 401 and the n-type top contact layer 305 in this embodiment. The tunnel junction layer 401 may be adjacent the n-type bottom injection layer 400 and/or may be positioned between the n-type bottom injection layer 400 and the emission region 402.

In some embodiments, the bottom electrical contact 301 has a thickness of 100/600/300/500/1000 angstroms. The bottom electrical contact 301 may be composed of Pd/Ge/Au/Pt/Au. However, in alternative embodiments, the bottom electrical contact 301 is composed of Pd/In/Pd/Pt/Au. In some embodiments, the bottom electrical contact layer 301 may be adjacent to the bottom injection layer of the heterostructure 200.

Figure 5:
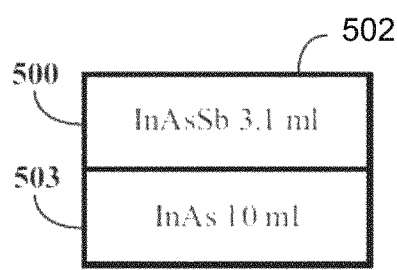
FIGS. 5 to 8 each illustrate exemplary superlattice structures for a light emitting diode device according to embodiments of the present disclosure.

FIG. 5 illustrates a superlattice structure for a light emitting diode device 1 according to one disclosed embodiment. In this embodiment, the emission region 502 comprises repeats of an electron well layer 503 and a hole well layer 500. The hole well layer 500 may comprise InAsSb. The electron well layer 503 may comprise InAs. In this embodiment, the InAs/InAsSb superlattice structure has a thickness of about 3.1/10 monolayers. In some embodiments, the InAsSb layer 500 has a thickness of about 3.1 monolayers and an antimony concentration of 37%. The InAs layer 503 may have a thickness of about 10 monolayers.

Figure 6:
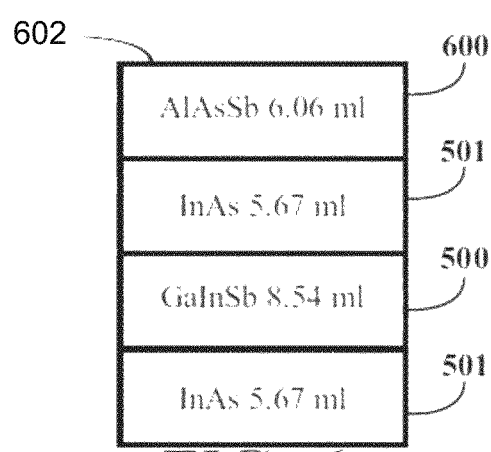

FIG. 6 illustrates a superlattice structure for a light emitting diode device 1 according to an embodiment. In this embodiment, the emission region 602 comprises a first electron well layer 501, hole well layer 500, a second electron well layer 501 and a barrier layer 600. Spatially, the hole well layer 500 is positioned in between electron well layers 501, such that electron well layers 501 are positioned on both sides of each hole well layer 500. In this embodiment, the barrier layer 600 is positioned on one side of the first electron well layer 501.

In some embodiments, the electron barrier layer 600 is defined as an aluminum-containing layer of a four-layer superlattice structure, with the barrier layer 600 comprising AlAsSb. In an embodiment, the first electron well layer 501 comprises InAs. The hole well layer 500 may include GaInSb in an embodiment. The second electron well layer 501 may comprise InAs.

In some embodiments, the InAs/GaInSb/InAs/AlAsSb superlattice structure of FIG. 6 has a total thickness of about 1 micron. In other embodiments, the thickness of the structure or heterostructure may range from about 100 nm to about 2 microns. In some embodiments, the InAs/GaInSb/InAs/AlAsSb superlattice structure comprises thin-film layers with a thickness of 5.67/8.54/5.67/6.06 monolayers, respectively, with 30% indium in the GaInSb layer, and 27% As in the AlAsSb layer.

The InAs/GaInSb/InAs/AlAsSb structure may repeat to form a superlattice, including the barrier layer 600, the first electron well layer 501, the hole well layer 500, and the second electron well layer 501. The InAs/GaInSb/InAs/AlAsSb superlattice structure may yield an optimal mid-wavelength infrared radiance, where there are n cascading structures of the four-layer superlattice structure. In accordance with disclosed embodiments, efficiency of the LEDs are affected by the thicknesses and/or number of periods of cascading structures as illustrated in more detail in the drawing figures herein. For example, upon examining FIGS. 11-13, disclosed embodiments illustrate the dependence of IQE on carrier density. Carrier density will be determined by the current injection, and the total thickness of the superlattice. In general, thicker superlattices will yield more efficient LEDs, because they will allow them to operate at lower or optimum carrier densities. Thus, in accordance with disclosed embodiments, it is shown that efficiency increases as the number of cascaded stages increase. Cascading allows lower current operation, reducing carrier density and also ohmic loss. Additionally provided figures including, for example, FIGS. 14C and 15C, show IQE also depends on thickness of individual superlattice layers, as further explained below.

Figure 7:
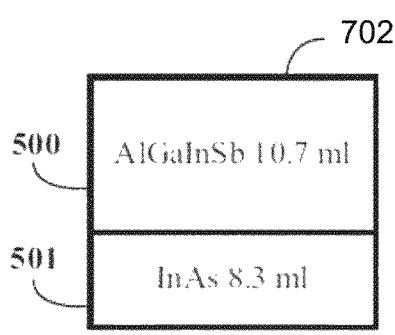

FIG. 7 illustrates a superlattice structure for a light emitting diode device 1 according to an embodiment. In this embodiment, the emission region 702 comprises repeats of an electron well layer 501 and a hole well layer 500. In some embodiments, the hole well layer 500 may be formed of AlGaInSb. In one disclosed embodiment, the electron well layer 501 comprises InAs.

In some embodiments, the InAs/AlGaInSb superlattice structure may have a thickness of about 8.3/10.7 monolayers. In another exemplary embodiment, the thickness of the InAs/AlGaInSb superlattice structure may range from a minimum of about 8/6.8 monolayers to a maximum thickness of about 8.6/20.6 monolayers. In some embodiments, the AlGaInSb layer contains about 10% aluminum, and 3.7-12% indium i.e., enough to lattice match the superlattice to GaSb. In some embodiments, the InAs/AlGaInSb superlattice structure has a total thickness of about 500 nm. In other embodiments, the thickness of the InAs/AlGaInSb superlattice structure may range from about 100 nm to about 2 microns.

Figure 8:
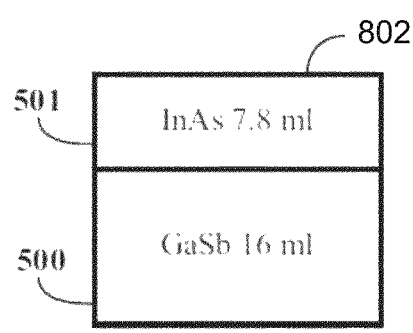

FIG. 8 illustrates a superlattice structure for a light emitting diode device 1 according to an embodiment. In this embodiment, the emission region 802 comprises repeats of an electron well layer 501 and a hole well layer 500. The hole well layer 500 may being formed of GaSb. In an embodiment, the electron well layer 501 comprises InAs. In some embodiments, the InAs/GaSb superlattice structure may have a total thickness of about 1 micron. In other embodiments, the thickness of the InAs/GaSb superlattice structure may range from about 100 nm to about 2 microns. The layers of the InAs/GaSb superlattice structure may have a thickness of 7.8 monolayers and 16 monolayers, respectively. In some embodiments, the thickness of GaSb may range from 8.3 monolayers to 26 monolayers.

In some embodiments, the emission regions 502, 602, 702 and 802 comprise superlattice structures detailed in FIGS. 5 to 8 that substantially knock out valence band states to substantially suppress Auger scattering. The radiation-less recombination of electron-hole pairs in semiconductors may be detrimental to the operation of light emitting diodes. Auger recombination, a prominent many-body scattering mechanism, may facilitate efficient non-radiative recombination by transferring the released energy and momentum to a third carrier.

In some embodiments, the tunnel junction 306 may have dimensions that are similar to those defined with respect to the tunnel junction layer 401. The tunnel junction 306 may comprise substantially similar materials to those that are defined with respect to the tunnel junction layer 401, as described herein. The tunnel junction 306 may include an n-type electron-blocking layer that comprises AlInAsSb or GaInAsSb.

The n-type electron-blocking layer of tunnel junction 306 may be shaped like a thin-film layer. The n-type hole-blocking layer interacts with a p-type electron-blocking layer to facilitate carrier recycling. The p-type electron-blocking layer may comprise GaSb. Each tunnel junction may comprise a pair of layers forming a reverse biased np junction within the overall forward biased p . . . n LED.

Spatially, the n-type hole-blocking layer may be positioned between the p-type electron-blocking layer and the emission layer. In some embodiments, the p-type electron-blocking layer has a thickness in substantially the same range as the n-type electron-blocking layer.

The tunnel junctions (both the tunnel junction 306 and the tunnel junction layer 401) may be configured to substantially prevent electron leakage between the plurality of emission regions prior to radiative recombination (i.e., when an electron moves from its conduction band state to the empty valence band state associated with the hole for photon emission).

Figure 9:
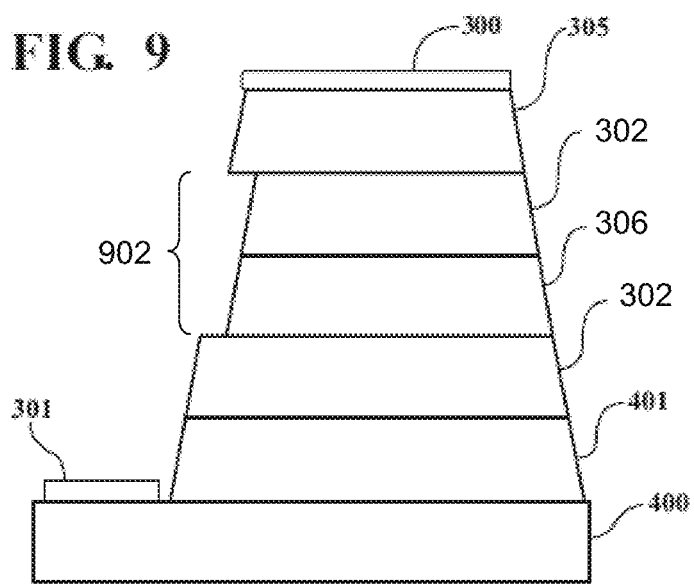
FIG. 9 illustrates a heterostructure of a light emitting diode device according to another embodiment of the present disclosure.

FIG. 9 illustrates another disclosed embodiment for a superlattice structure showing, for example, emission regions 302 having tunnel junction 306 disposed there between. For the pair 902 of layers 306/302, there can be n repeats of this pair 902, where n is the number of times the superlattice emission region is cascaded.

Figure 10:
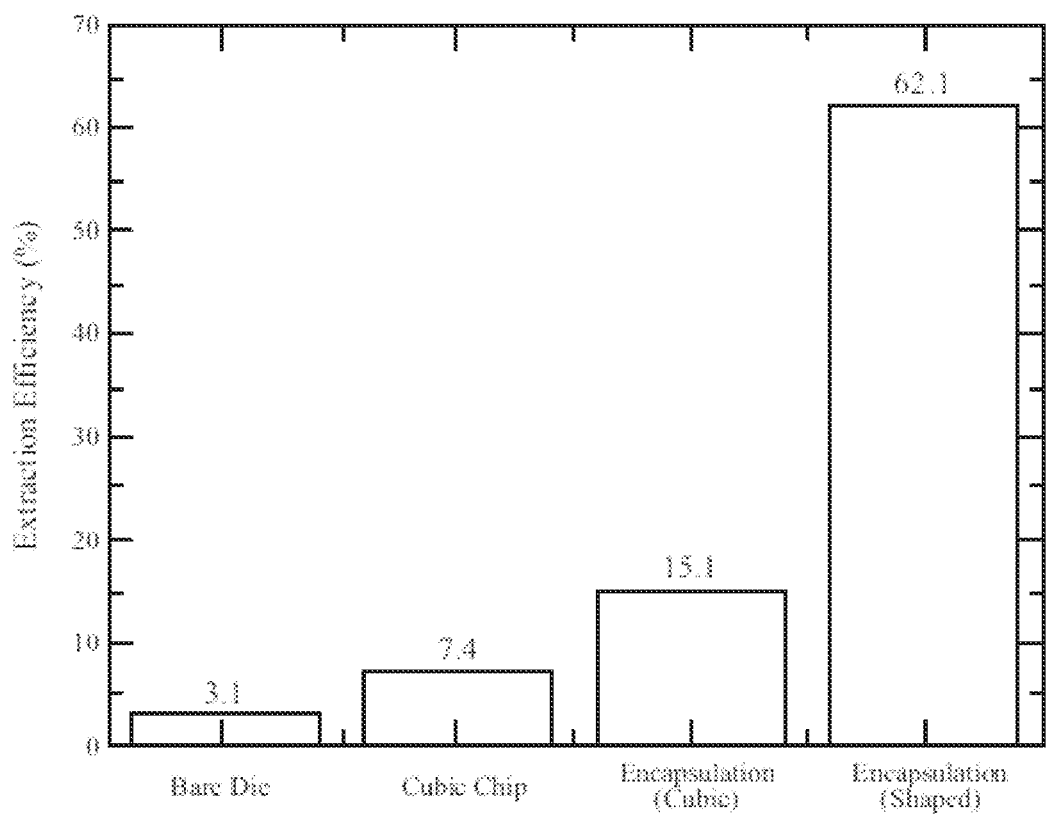
FIG. 10 illustrates geometric simulation results of extraction efficiency for several light emitting diode devices according to one embodiment of the present disclosure.

FIG. 10 illustrates ray tracing simulation results of extraction efficiency for several light emitting diode devices 1 according to a disclosed embodiment. Four chip designs of LEDs were tested for extraction efficiency. An LED may be efficient when the light extraction is maximized. Light may be produced internally by injected carriers. Due to a phenomenon known as total internal reflection (TIR), much of the light emitted in the LED is trapped in the LED. TIR is predicted by Snell's Law, and results when light travels from a material with high index of refraction to low index of refraction. Light emitted beyond a critical angle (arcsin(1/n)) will be totally internally reflected. For a planar slab, only about ¼ n^2 will escape. The light that escapes is incident on the exit face at an angle below critical; this constitutes what is called an escape cone for the light. Because the index of refraction n of these materials is very high, about 3.8, only a tiny fraction of light escapes. We have detailed ways to enhance extraction, mainly with chip shaping and encapsulation.

In an exemplary embodiment of the disclosed invention, the four chip designs included in the ray tracing simulation may include, for example, a bare die, a cubic chip, an encapsulated cubic chip, and an encapsulated shaped chip, i.e., chip shaping. Different chip shapes can enhance the light extraction. We have found the trapezoidal shape extracts the most light, but it is the hardest to manufacture. The angled sidewalls cause laterally emitted light to often be reflected inside the escape cone. We found that the best shape is a trapezoid that is half as tall as the (shorter) base is wide. In addition, encapsulation helps with light extraction because: 1) it has higher index than air and it gives a larger escape cone for the LED; and 2) since the exit face is spherically curved, the light tends to fall within the escape cone.

Thus, in one exemplary embodiment, the bare die has an IQE of about 3%. In some cases, the bare die has an IQE of above 3% such as at about 3.1%. In another disclosed embodiment, the cubic chip has an IQE of about 7%. In some cases, the cubic chip has an IQE of above 7% such as at about 7.4%. In another disclosed embodiment, the encapsulated cubic chip has an IQE of about 15%. In some cases, the encapsulated cubic chip has an IQE of above 15% such as at about 15.1%. In yet another disclosed embodiment, the encapsulated shaped chip has an IQE of about 62%. In some cases, the encapsulated shaped chip has an IQE of above 62% such as at about 62.1%. The encapsulated shaped chip may be similar to the chip shown in FIGS. 1-3. In a disclosed embodiment, the combination of encapsulation plus having a pyramidal trapezoid shaped semiconductor chip may lead to approximately four times the light extraction efficiency over the encapsulated cubic chip alone, and approximately 10 times the light extraction efficiency over other non-encapsulated semiconductor chips.

Figure 11A:
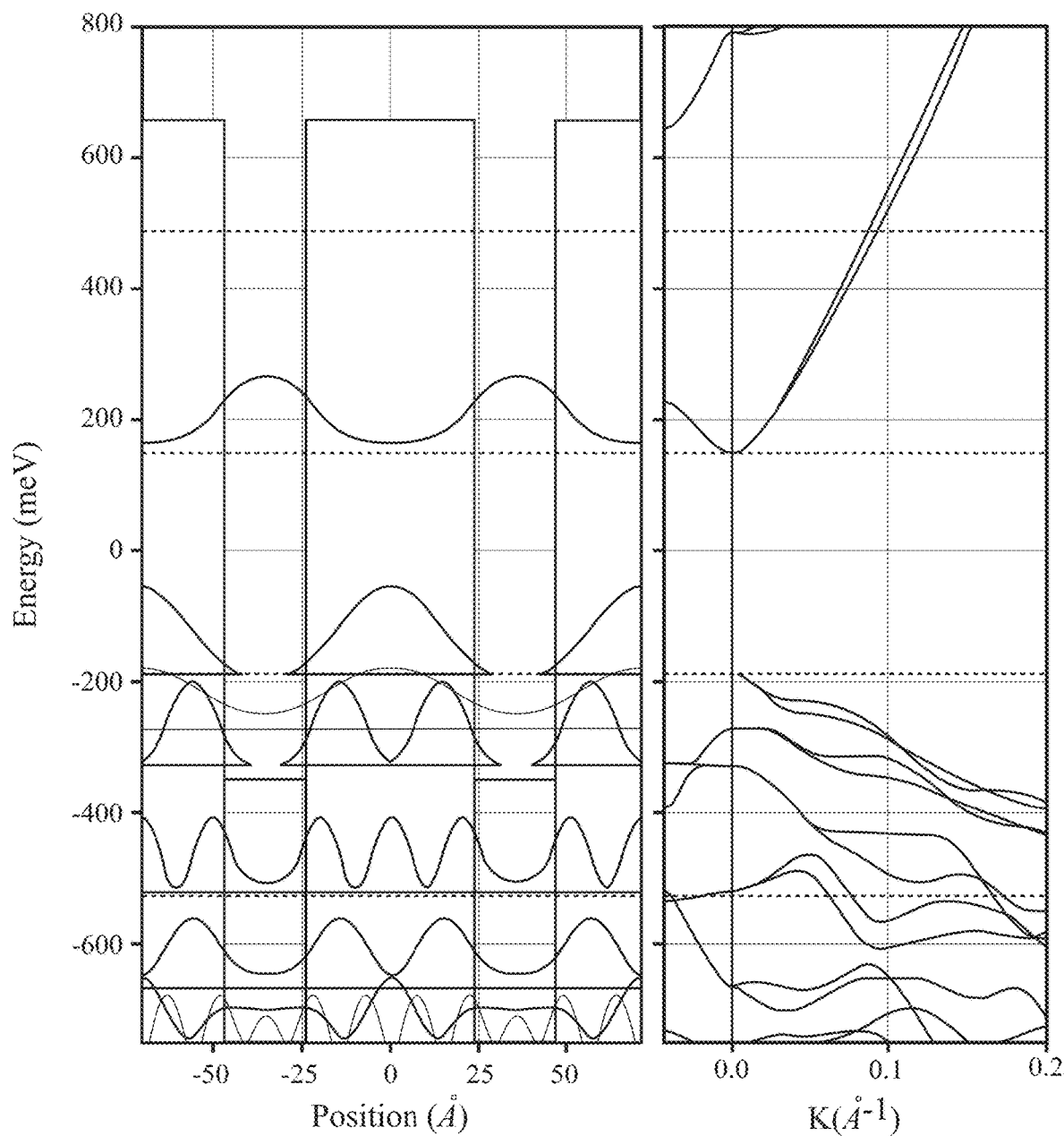
FIGS. 11A to 11C illustrate simulation results for a InAs/GaSb superlattice structure of a light emitting diode device according to one embodiment of the present disclosure.
Figure 11B:
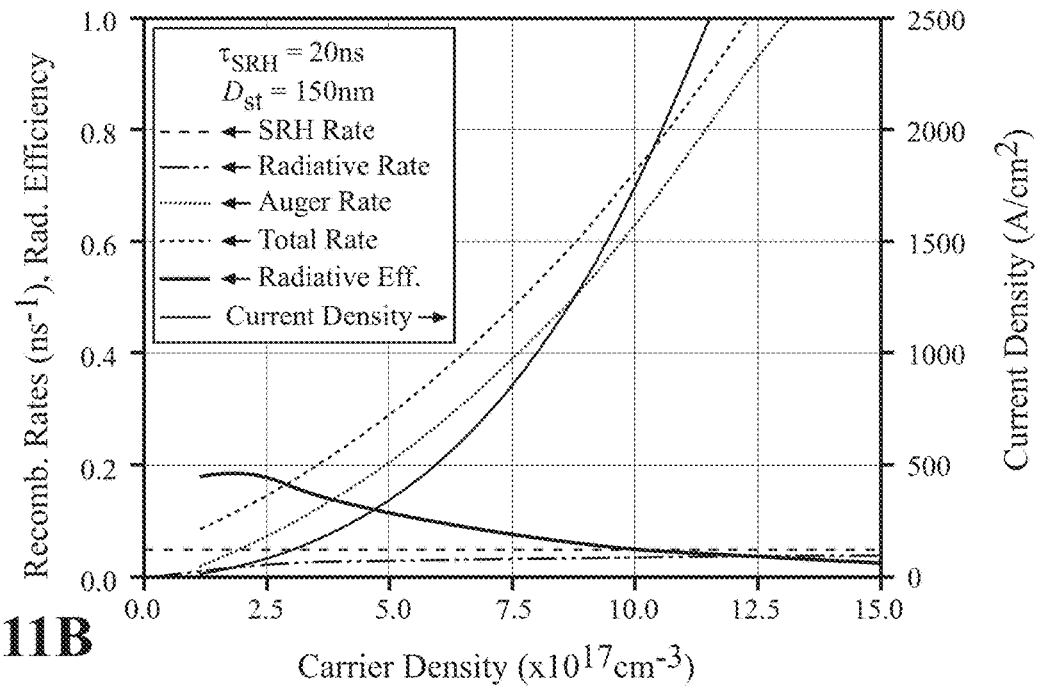
Figure 11C:
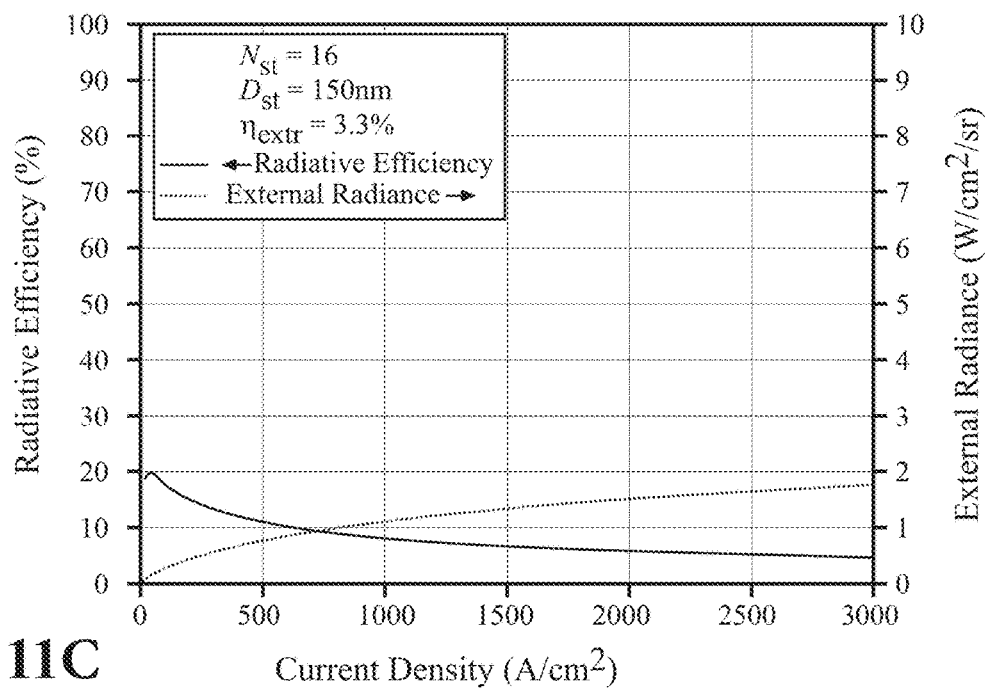

FIGS. 11A to 11C illustrate simulation results for a InAs/GaSb superlattice structure of a light emitting diode device 1 according to one disclosed embodiment. FIG. 11A illustrates band diagrams for the InAs/GaSb superlattice at a temperature of about 77 K and at an energy bandgap (e.g., the energy difference between the top of the valence band and the bottom of the conduction band) of about 337.9 meV.

FIG. 11B illustrates several rates associated with FIG. 11A. The Auger recombination rate of FIG. 11A embodiment is illustrated in the chart. For Auger recombination, the electron drops into the valence band and energy is transferred to another carrier. In an embodiment, heat is thereby generated, but no light is generated. The Auger recombination rate is proportional to the square of the carrier density. In embodiments illustrated herein, the states that contribute to the Auger process may be cleared out and minimized by moving states to greater than an energy gap below the valence band edge.

The radiative recombination rate of FIG. 11A embodiment is illustrated in FIG. 11B. The radiative recombination rate may be the rate at which an electron and hole recombine to generate a photon, as opposed to a phonon or heat. This rate may be proportional to the carrier density. The higher the carrier density, generally the more light may be produced. This rate may be maximized by the spatial overlap of electrons in the InAs layer with holes in the GaSb layer.

The Shockley-Read-Hall (SRH) recombination rate of FIG. 11A embodiment is illustrated in FIG. 11B. The Shockley-Read-Hall (SRH) recombination rate is also called that trap-assisted recombination rate. FIG. 11B illustrates SRH recombination rate versus carrier density for the InAs/GaSb superlattice at a Shockley-Read-Hall lifetime of 20 ns with a superlattice thickness of about 1000 nm. Defects in the crystalline structure may cause the bandgap to leak current. The rate of leakage may depend on the number and associated energy of the defects, but not on the carrier density. Heat is thereby generated, but no light. To optimize performance of the superlattice structure, defects in the structure may be minimized. The total carrier recombination rate may include the sum of the Auger rate, the radiative rate and the SRH rate in some embodiments.

FIG. 11C illustrates the radiative recombination efficiency and external radiance of the InAs/GaSb superlattice where N layers in the superlattice is about 60, and the superlattice has a thickness of about 1000 nm.

Figure 12A:
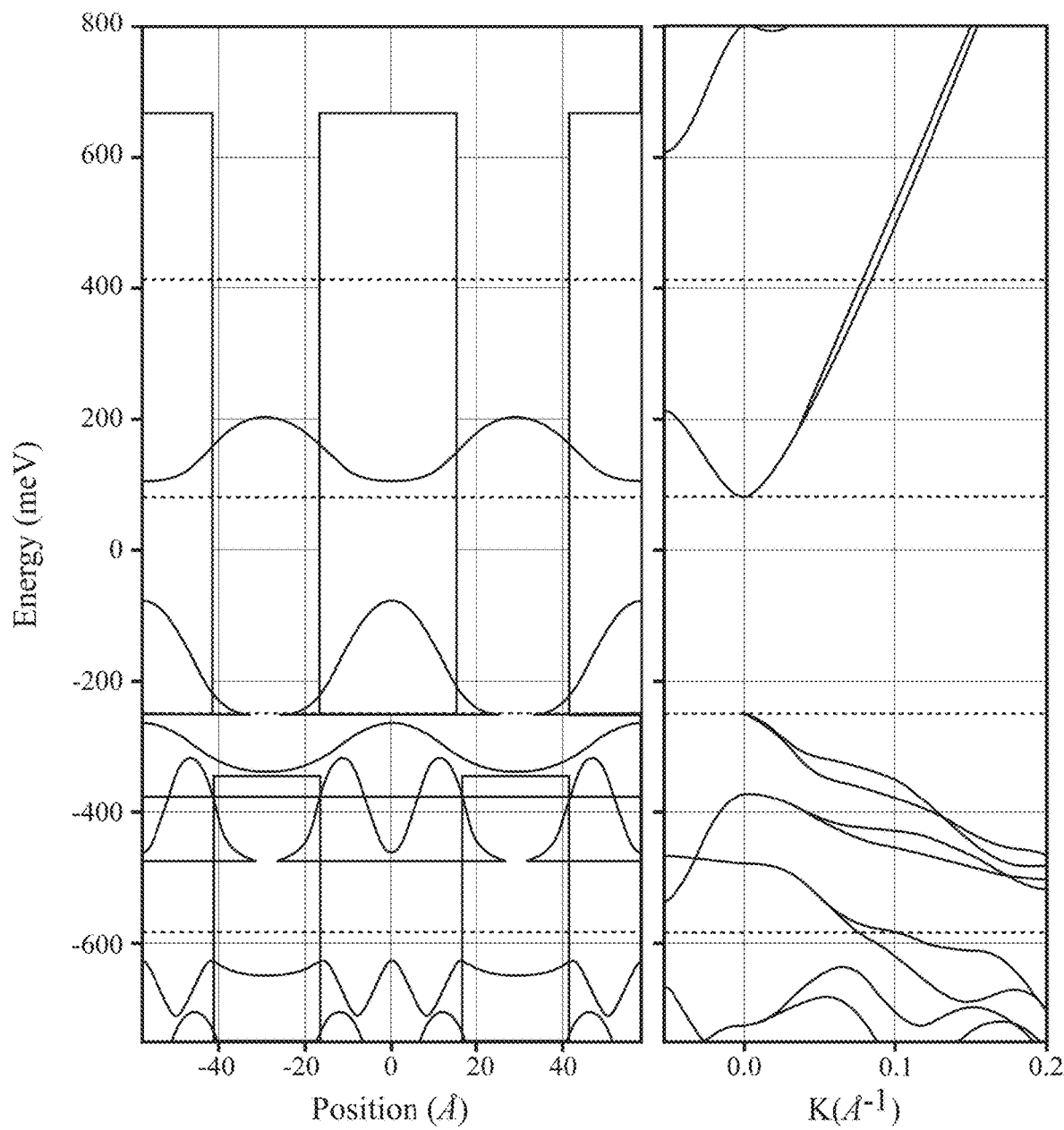
FIGS. 12A to 12C illustrate simulation results for an InAs/Al$_{0.10}$GaIn$_{0.07}$Sb superlattice structure of a light emitting diode device according to one embodiment of the present disclosure.
Figure 12B:
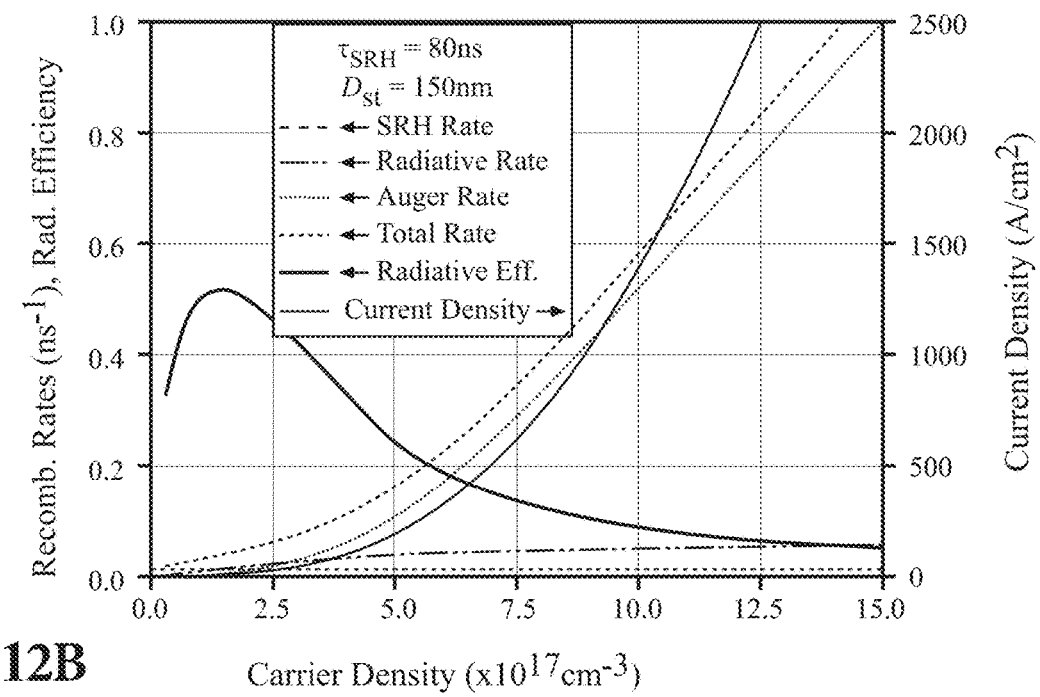
Figure 12C:
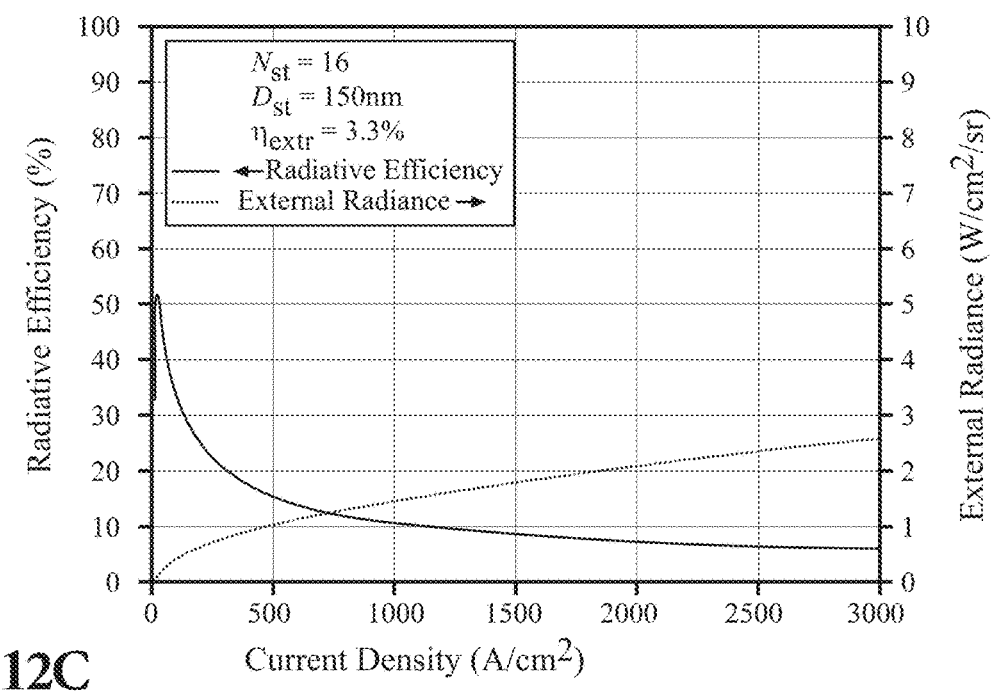

FIGS. 12A to 12C illustrate testing results for a InAs/$Al_{0.10}GaIn_{0.7}Sb$ superlattice structure of a light emitting diode device according to an embodiment. FIG. 12A illustrates band diagrams for the InAs/$Al_{0.10}GaIn_{0.7}Sb$ superlattice at a temperature of about 77 K and an energy bandgap of about 332.4 meV. In a disclosed embodiment, the GaSb layer of FIG. 11A is 16 ML, which is about 48 Å. By putting Al in the hole well layer, a thinner hole well layer may be used, such as 10.7 ML. The InAs layer may be thickened to 8.3 ML from the embodiment of FIG. 11A. Also, in FIG. 12A, In may be incorporated into the hole well layer to lattice match the structure.

FIG. 12B illustrates the Auger rate, radiative recombination rate, SRH recombination rate, radiative recombination efficiency, and current density functions for the InAs/$Al_{0.10}GaIn_{0.7}Sb$ superlattice at a Shockley-Read-Hall lifetime of about 80 ns and at a superlattice thickness of about 1000 nm. FIG. 12C illustrates radiative recombination efficiency and external radiance of the InAs/$Al_{0.10}GaIn_{0.7}Sb$ superlattice where N layers in the superlattice is about 60, and the superlattice has a thickness of about 1000 nm.

Figure 13A:
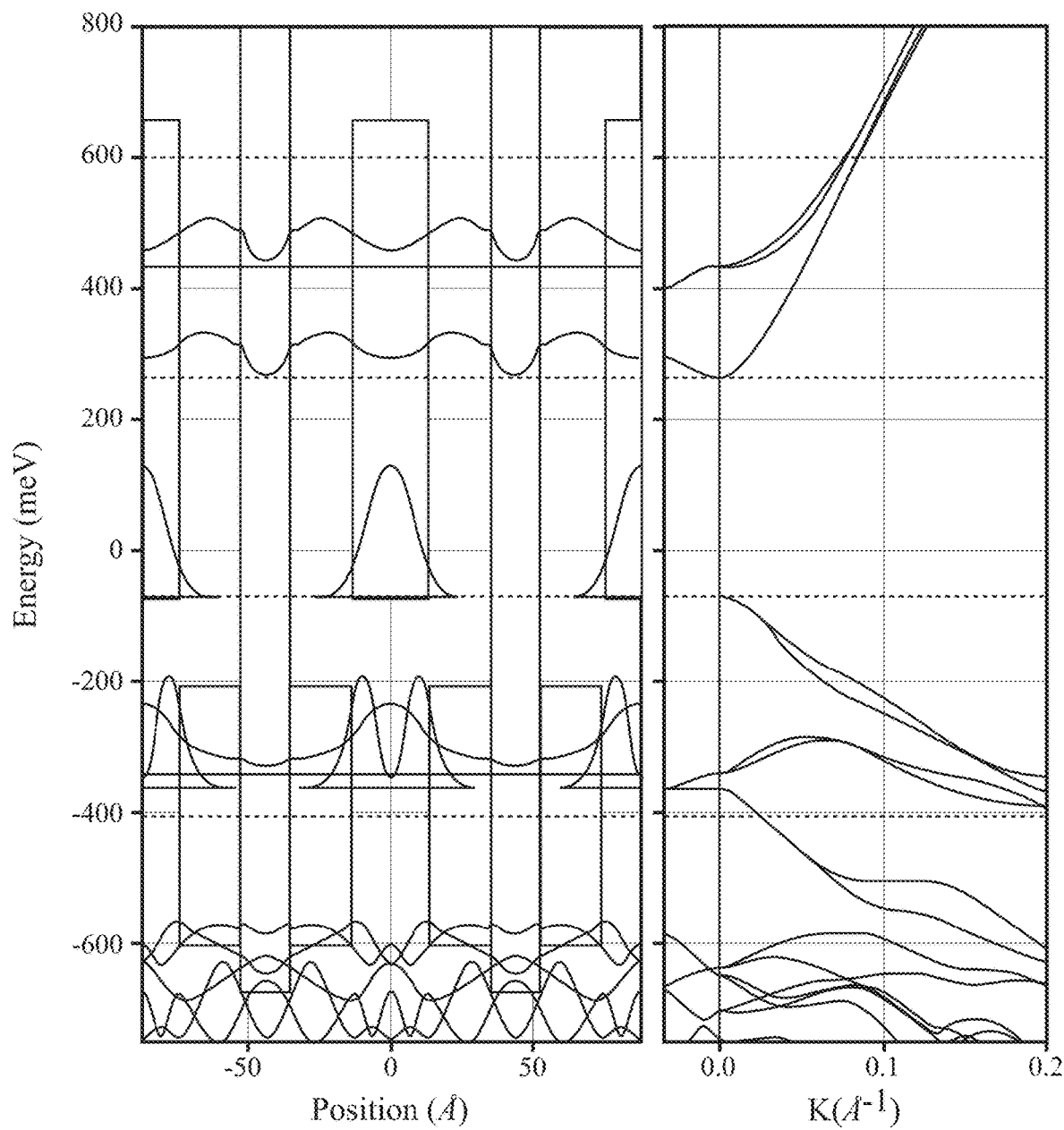
FIGS. 13A to 13C illustrate simulation results for a four-layer superlattice structure of a light emitting diode device according to one embodiment of the present disclosure.
Figure 13B:
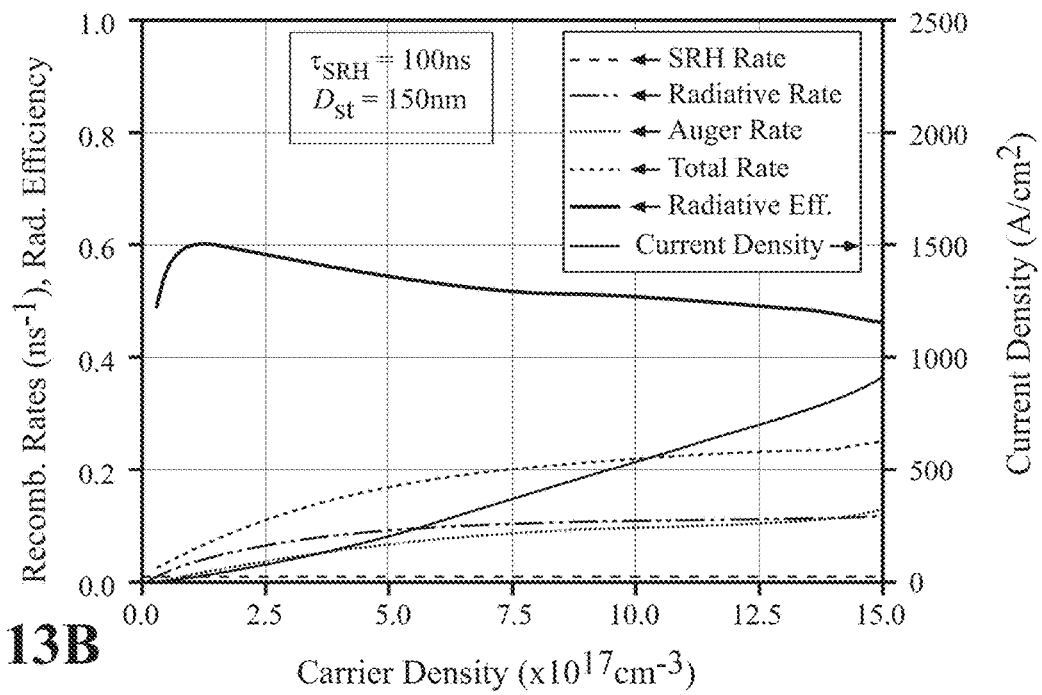
Figure 13C:
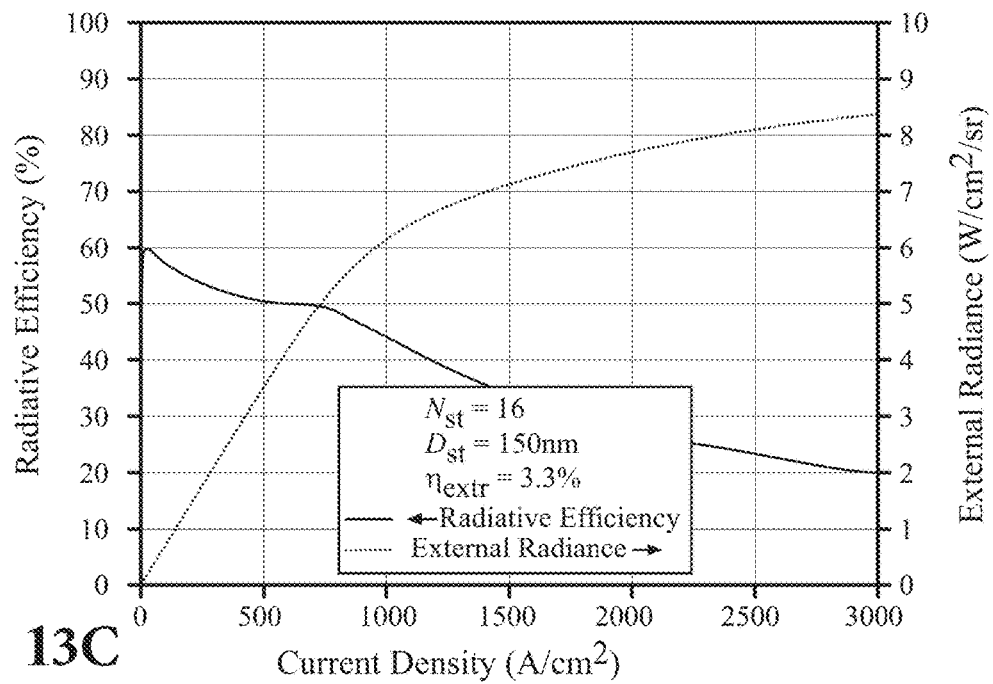

FIGS. 13A to 13C illustrate simulation results for the four-layer superlattice (FLSL) structure of a light emitting diode device according to an embodiment. FIG. 13A illustrates band diagrams for the FLSL at a temperature of about 77 K and an energy bandgap of about 335.4 meV The addition of the wide bandgap blocking layer may allow for dramatic clearing of valence band Auger states. FIG. 13B illustrates the Auger rate, radiative recombination rate, SRH recombination rate, radiative recombination efficiency, and current density functions for the four-layer superlattice at a Shockley-Read-Hall lifetime of about 100 ns and having a superlattice thickness of about 150 nm. FIG. 13C illustrates radiative recombination efficiency and external radiance of the FLSL where N layers in the superlattice is about 30, and the superlattice has a thickness of about 500 nm.

Figure 14B:
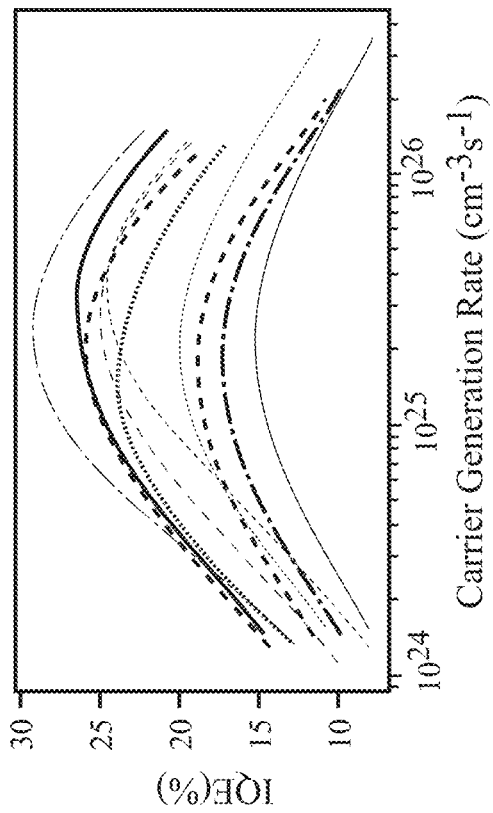
FIGS. 14A to 14C illustrate measurement/testing results of quantum efficiency measurements for increasing the thickness of GaSb layers in an InAs/GaSb superlattice structure of a light emitting diode device according to one embodiment of the present disclosure.
Figure 14C:
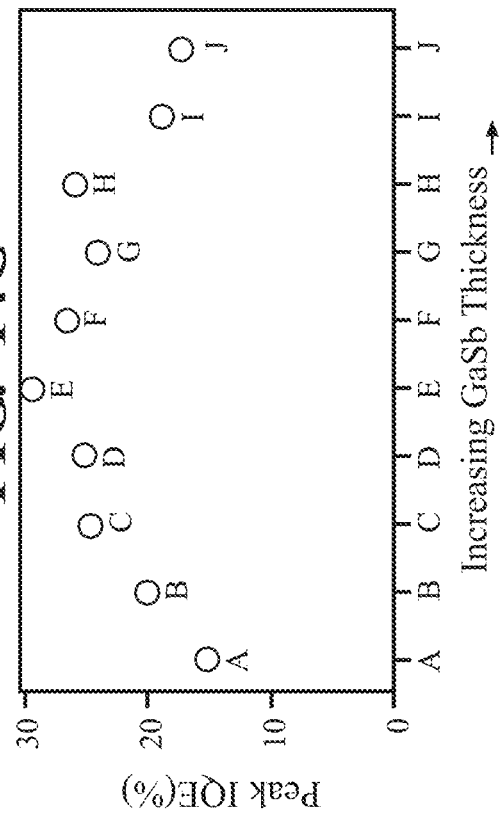
Figure 14A:
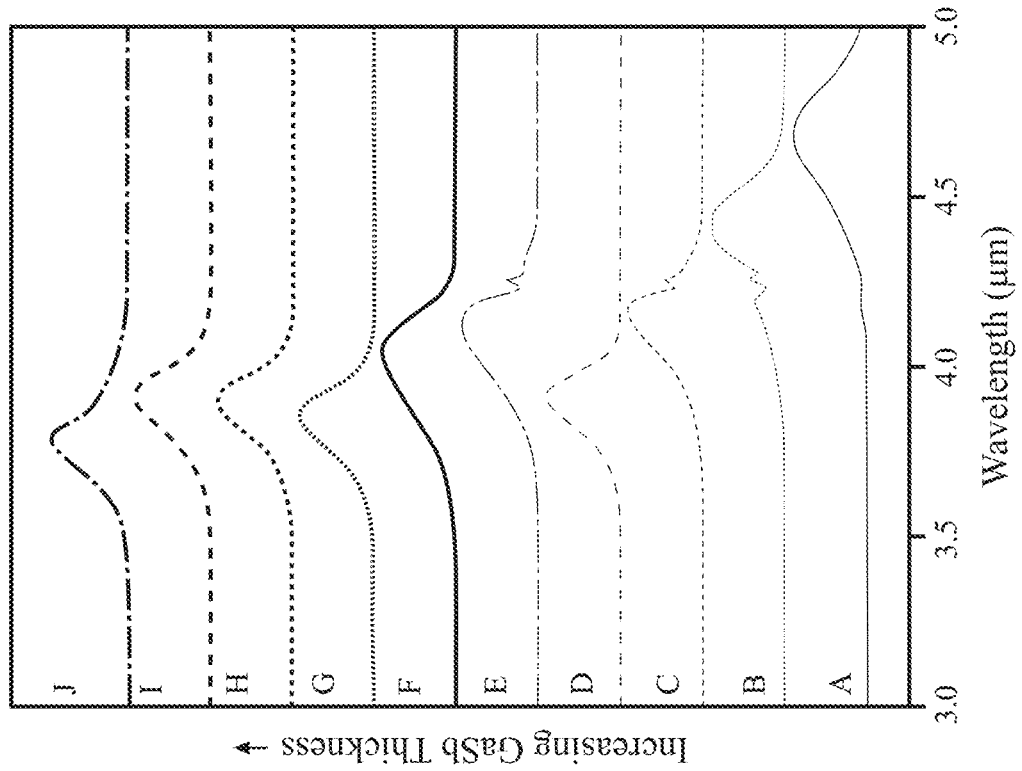

FIGS. 14A to 14C illustrate testing results of quantum efficiency measurements for increasing the thickness of GaSb layers in about ten (10) InAs/GaSb superlattice structures of a light emitting diode device according to embodiments. In each of the structures, the InAs layer is about 7.8 ML. The GaSb layers were the following thicknesses: A) 9 ML, B) 11 ML, C) 14 ML, D) 16 ML, E) 16 ML (same as D), F) 18 ML, G) 20 ML, H) 22 ML, I) 24 ML, and J) 26 ML. FIG. 14A illustrates the relationship between the thickness of GaSb in the superlattice structure and emission spectra. FIG. 14B illustrates the relationship between the thickness of GaSb in the superlattice structure and the peak internal quantum efficiency, as a measure of a superlattice structures light generation efficiency. FIG. 14C illustrates the relationship between carrier generation rate (the rate at which mobile charge carriers (e.g., electrons and electron holes) are created and eliminated) and internal quantum efficiency for the InAs/GaSb superlattice structure having different thicknesses of GaSb.

Figure 15B:
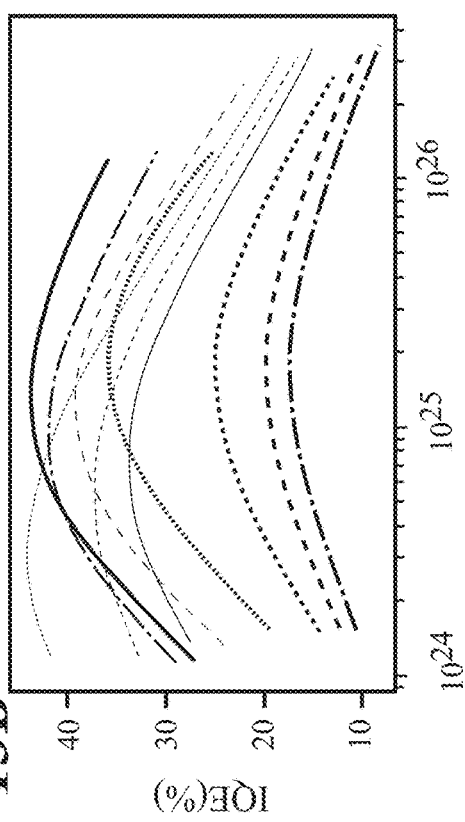
FIGS. 15A to 15C illustrate measurement/testing results of quantum efficiency measurements for increasing the thickness of AlGaInSb layers in an InAs/AlGaInSb superlattice structure of a light emitting diode device according to one embodiment of the present disclosure.
Figure 15C:
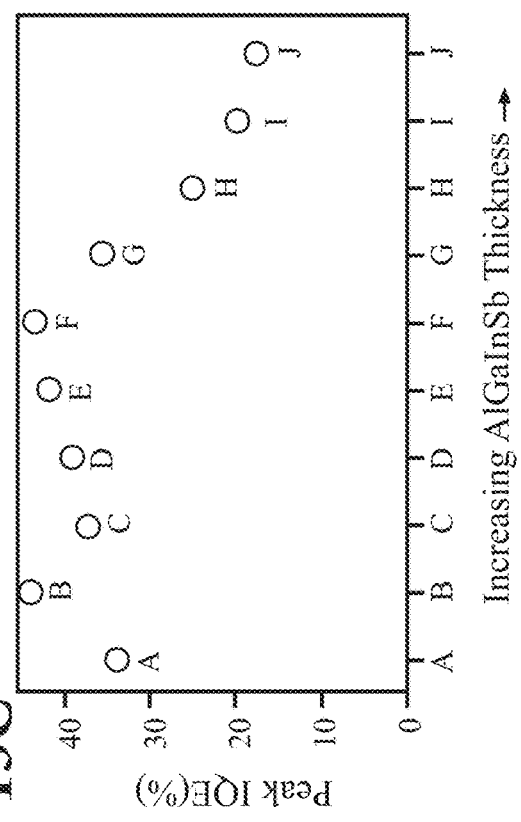
Figure 15A:
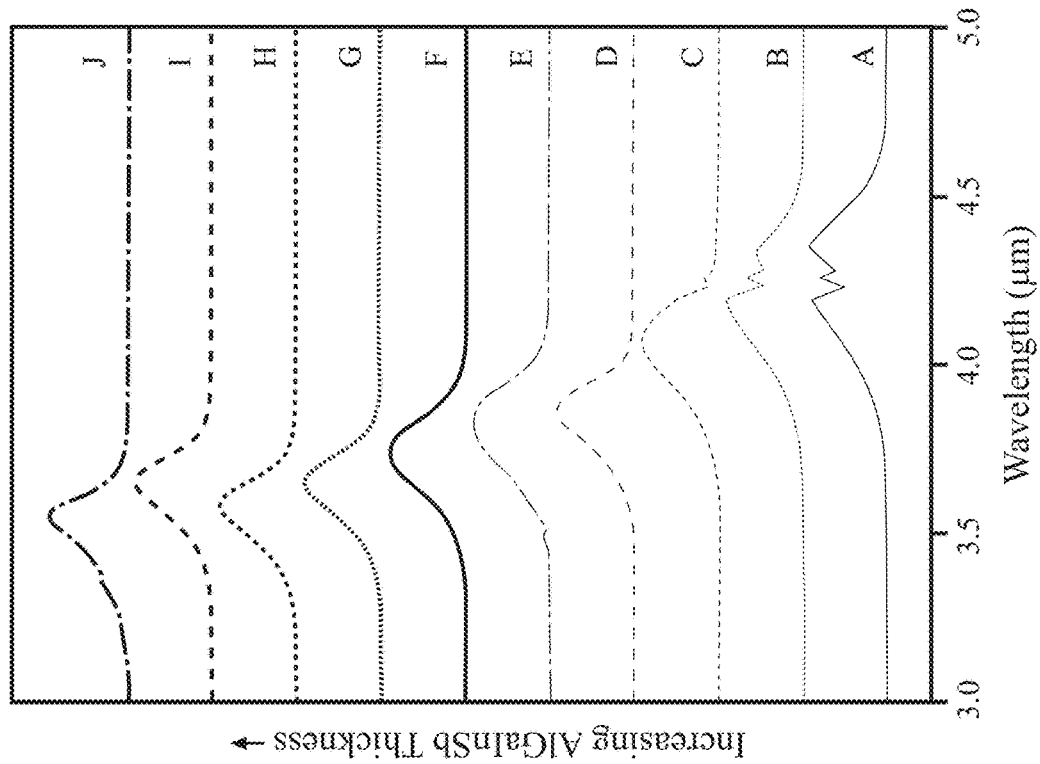

FIGS. 15A to 15C illustrate testing results of quantum efficiency measurements for increasing the thickness of AlGaInSb layers in 10 InAs/AlGaInSb superlattice structures of a light emitting diode device according to embodiments. The InAs/AlGaInSb layers were the following thicknesses: A) 8 ML/6.8 ML, B) 8 ML/7.8 ML, C) 8 ML/8.7 ML, D) 8.3 ML/10.7 ML, E) 8.3 ML/10.7 ML (same as D), F) 8.3 ML/12.7 ML, G) 8.5 ML/14.7 ML, H) 8.6 ML/16.6 ML, I) 8.6 ML 18.6 ML, and J) 8.6 ML/20.6 ML.

FIG. 15A illustrates the relationship between the thickness of AlGaInSb in the superlattice structure and the emission spectra. FIG. 15B illustrates the relationship between the thickness of AlGaInSb in the superlattice structure and the peak internal quantum efficiency. FIG. 15C illustrates the relationship between carrier generation rate and internal quantum efficiency for the InAs/AlGaInSb superlattice structure having different thicknesses of AlGaInSb.

Figures 16A, 16B, 16C:
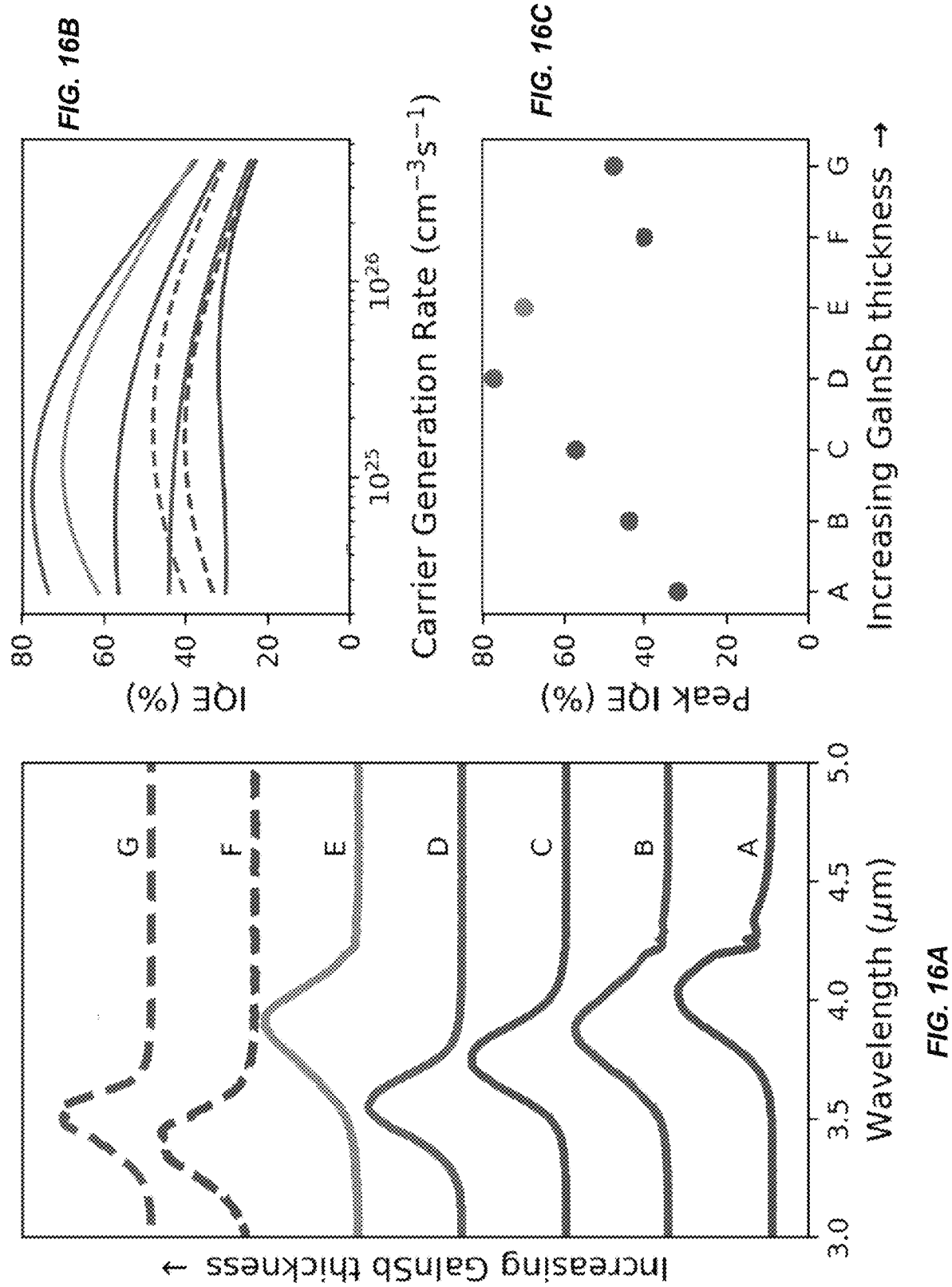
FIGS. 16A to 16C illustrate measurement/testing results of quantum efficiency measurements for increasing the thickness of GaInSb layers in about seven FLSL structures of a light emitting diode device according to one embodiment of the present disclosure.

FIGS. 16A-16C illustrate testing results of quantum efficiency measurements for increasing the thickness of GaInSb layers in about seven FLSL structures of a light emitting diode device according to disclosed embodiments. In each of the structures, the InAs layers of the four layer superlattice (AlAs(x)Sb(1−x)/InAs/Ga(0.70)In(0.30)Sb/InAs) are about 5.7 ML thick, and the AlAs(x)Sb(1−x) 6.1 ML thick. The GaInSb layers have variable thicknesses, and the concentration (x) of As in the AlAs(x)Sb(1−x) layer is adjusted for overall lattice matching of the FLSL to GaSb. The GaInSb thicknesses/As concentration (x) are approximately the following: A) 5.7 ML/0.14, B) 6.6 ML/0.19, C) 7.6 ML/0.23, D) 8.5 ML/0.27, E) 1.4 ML/0.34, F) 12.3 ML/0.41, G) 13.3 ML/0.47. FIG. 16A illustrates the relationship between the thickness of GaInSb in the superlattice structure and emission spectra. FIG. 16B illustrates the relationship between the thickness of GaInSb in the superlattice structure and the peak internal quantum efficiency, as a measure of a superlattice structures light generation efficiency. FIG. 16C illustrates the relationship between carrier generation rate (the rate at which mobile charge carriers (e.g., electrons and electron holes) are created and eliminated) and internal quantum efficiency for the FLSL superlattice structure having different thicknesses of GaInSb.

FIGS. 17A, 17B, 17C, 18 and 19 illustrate testing results comparing four different superlattice structure embodiments. The four superlattice structures include InAs/InAsSb, InAs/GaSb, InAs/AlGaInSb and FLSL (InAs/GaInSb/InAs/AlAsSb). FIG. 17A illustrates normalized photoluminescence spectra for the four different superlattice structure embodiments between wavelengths of 3 microns and 5 microns. Normalized photoluminescence may compare spectra from the four different superlattice structures. Comparison of the absolute values of photoluminescence signal may not be appropriate given the different structure of each embodiment of the superlattice. When the data is normalized, comparisons across the different superlattice structures between the peak positions and widths of the peaks may be appropriate. FIG. 17B illustrates the peak internal quantum efficiency for the four different embodiments of the superlattice structure. FIG. 17C illustrates the relationship between internal quantum efficiency and carrier generation rate for the four different embodiments of the superlattice structure.

Figure 18:
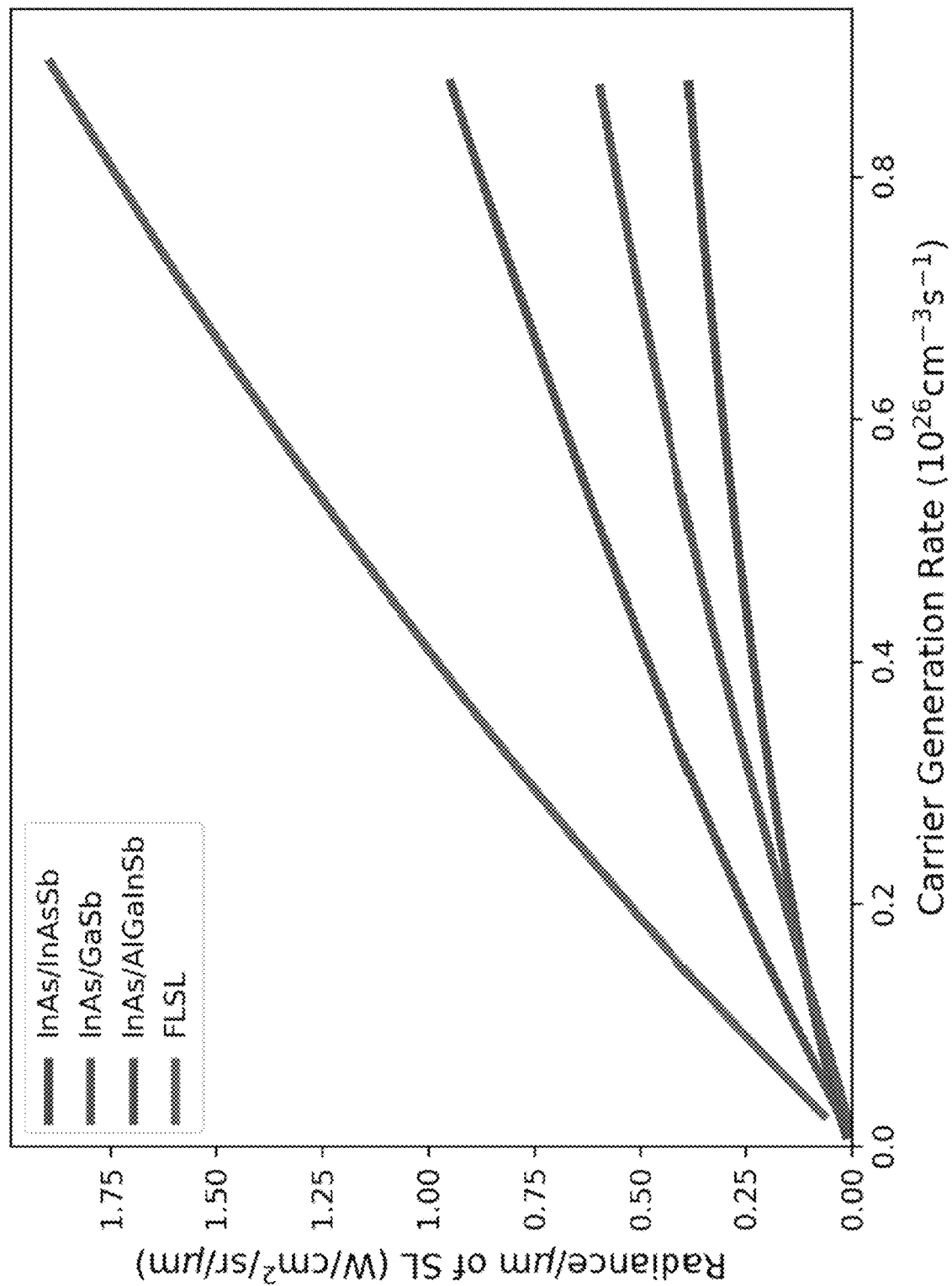
FIGS. 18 to 19 illustrate measurement/testing results comparing four different superlattice structure embodiments according to one embodiment of the present disclosure.

FIG. 18 illustrates the change in the radiance per total superlattice thickness as a function of the carrier generation rate for the four different embodiments of the superlattice structure.

Figure 19:
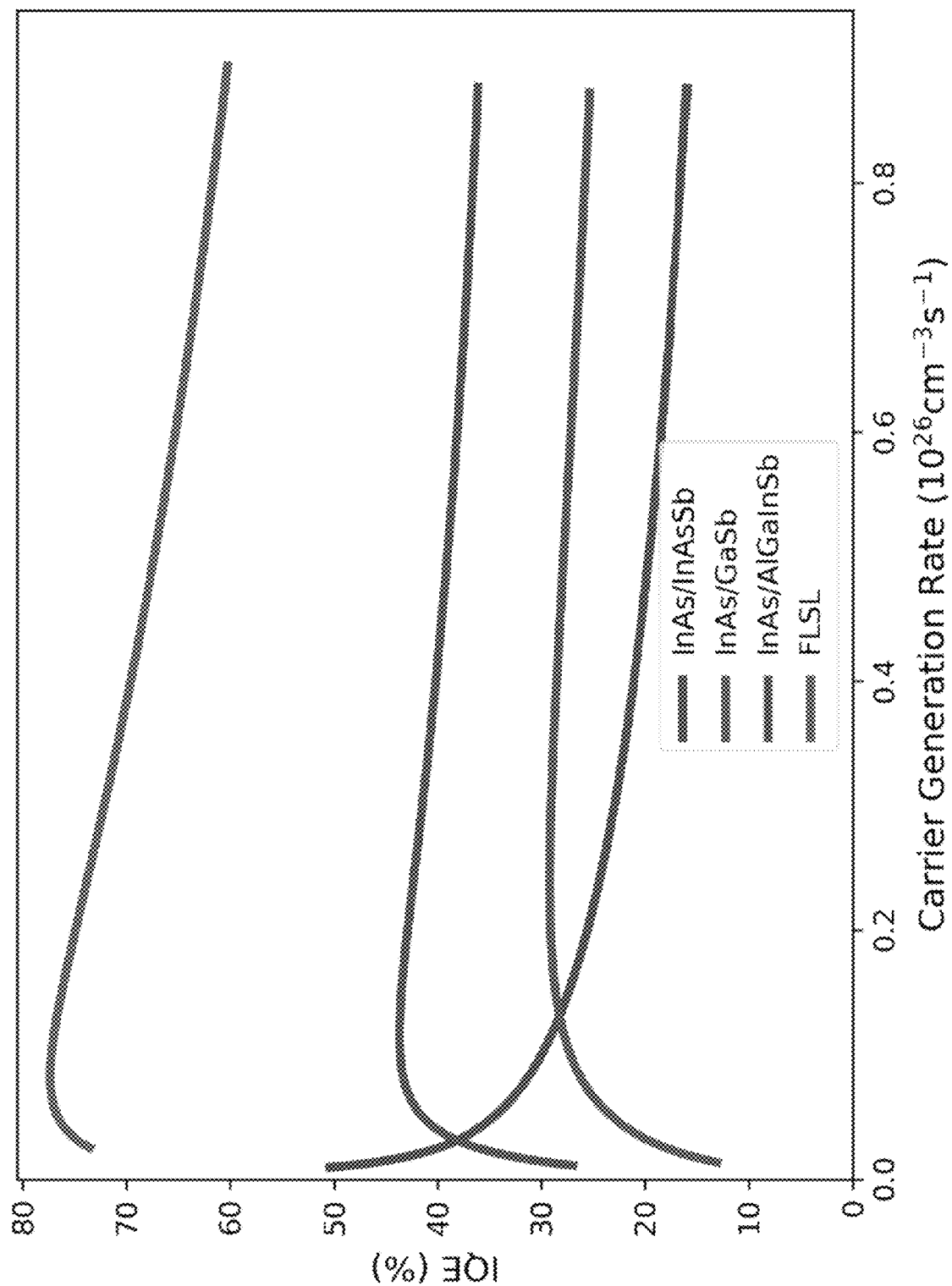

FIG. 19 illustrates the change in the internal quantum efficiency as a function of the carrier generation rate for the four different embodiments of the superlattice structure. The radiance of the FLSL structure is highest in the chart of FIG. 18. The IQE of the FLSL structure peaks at about 77% in the FIGS. 17B, 17C, and 19 charts.

The superlattice structure embodiments described herein may substantially optimize internal quantum efficiency (IQE) while substantially meeting target-operating conditions under high injection. The superlattice structure embodiments may have a peak IQE in a range of about 25% to 77% at 77 K.

Having described the many embodiments of the present disclosure in detail, it will be apparent that modifications and variations are possible without departing from the scope of the invention defined in the appended claims. Furthermore, it should be appreciated that all examples in the present disclosure, while illustrating many embodiments of the invention, are provided as non-limiting examples and are, therefore, not to be taken as limiting the various aspects so illustrated.

Exemplary Technique and Application

In accordance with disclosed embodiments, the present disclosure purports the IQE depends on the current injection, and peaks at different current injections in different superlattice designs. Through disclosed elements of bandstructure engineering (i.e., determined by the disclosed superlattice layer/material and design) nonradiative Auger scattering may be suppressed, and IQE enhanced. Thus, enhanced IQE is achieved by disclosed embodiments of the superlattices/superlattice structures recited herein.

Figure 20:
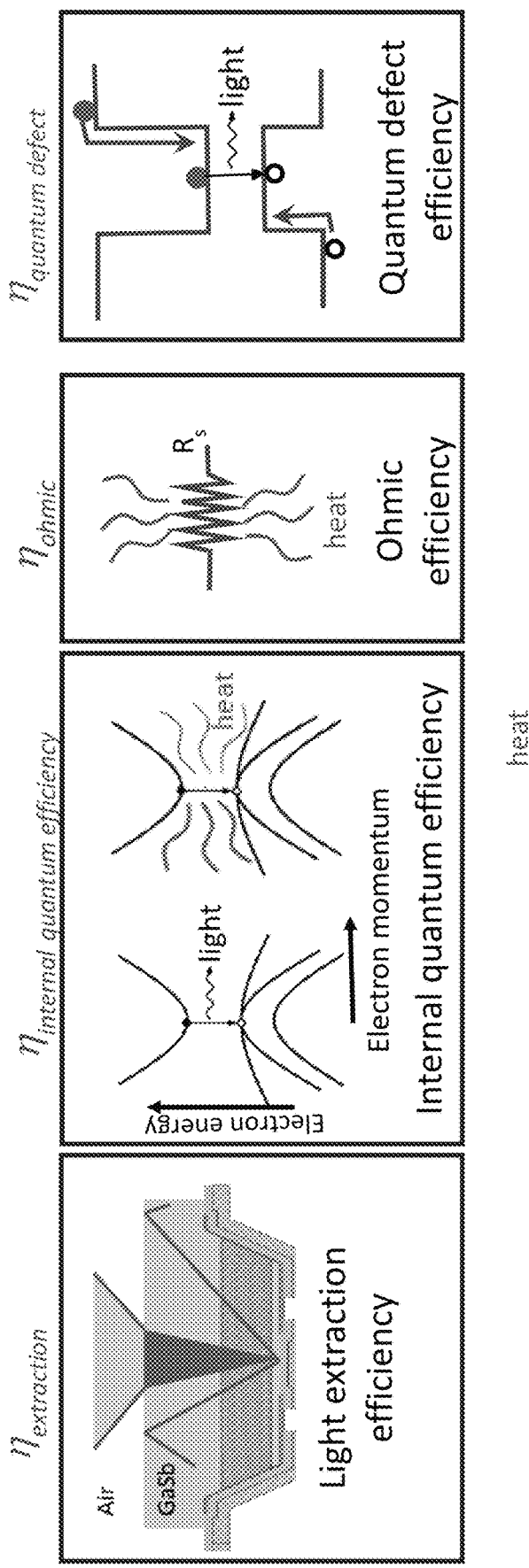
FIG. 20 graphically illustrates an LED efficiency breakdown according to one embodiment of the present disclosure.

In application, elements of the disclosed superlattice layer/material and design may be employed within specific techniques and application(s). An exemplary discussion of LED efficiency breakdown is provided as follows:

Wallplug efficiency is an important figure of merit of an LED, as it characterizes its energy efficiency of the LED. Accordingly:

$\eta_{wallplug}$: Wallplug efficiency is the optical power out of the LED/electrical power input Greater efficiency means an LED can run longer on a battery, generate less waste heat, and generate more light. These characteristics are important for practical applications, such as incorporation into low cost gas sensors. The overall wallplug efficiency of a device is influenced by several factors, as outlined, for example, in FIG. 20. One factor is the internal quantum efficiency. Thus, improvements in the internal quantum efficiency directly translate to higher wallplug efficiency. Internal quantum efficiency characterizes the probability that an injected (electron-hole) carrier pair will produce light rather than heat.

Figure 21:
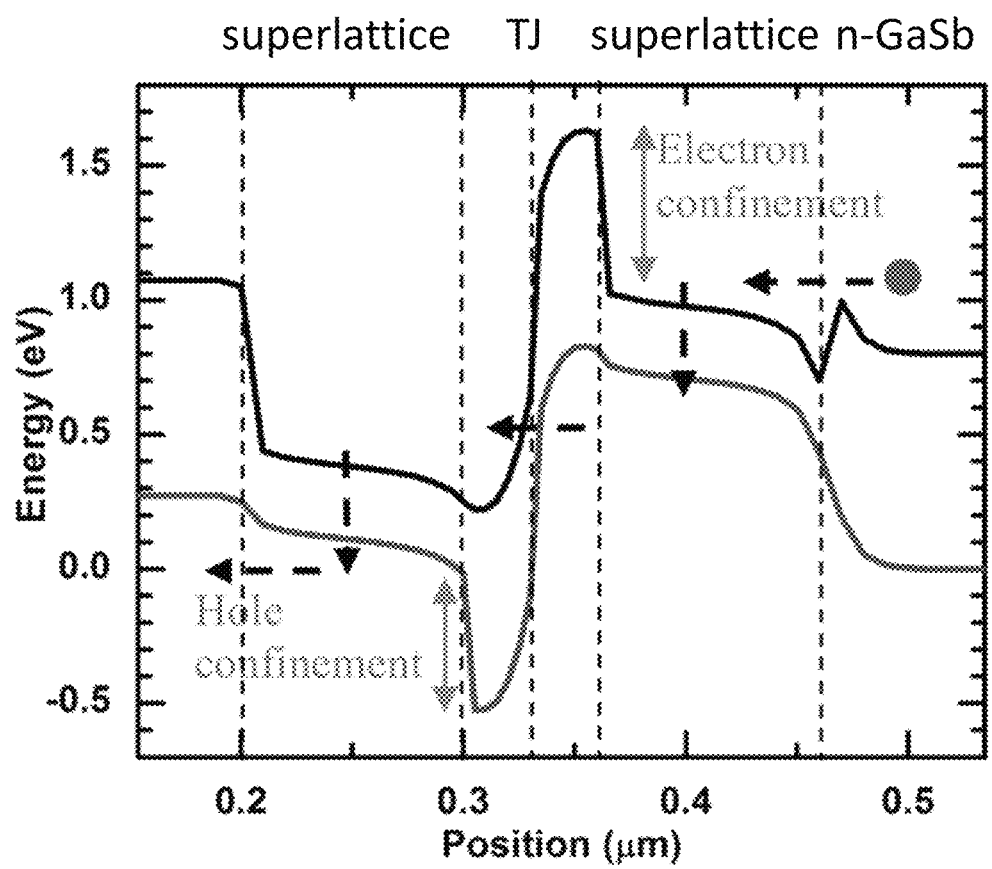
FIG. 21 illustrates a tunnel junction according to one embodiment of the present disclosure.

FIG. 21 is referenced, in a discussion of tunnel junction operation as applied to disclosed embodiments. A cascaded LED may be considered as multiple LEDs connected in series. Configuring LEDs in series is beneficial, because it allows more light to be generated with less current. The same current that drives the first LED may be recycled to drive the second LED. For a fixed current, N LEDs in series will produce N times as much light. (On the other hand, it takes N times as much voltage to drive N LEDs as one. But lower current, higher voltage devices are often desired for reduced ohmic or resistive loss).

In accordance with some disclosed embodiments, cascading is achieved in an LED by the use of a tunnel junction separating emission regions. The tunnel junction forces the current through each LED emission region before it progresses to the next LED. Without a tunnel junction, the LEDs would all basically short out.

An exemplary tunnel junction is illustrated in FIG. 21. It consists of a diode that when (reversed) biased, blocks an electron from getting through an emission region until it recombines with a hole. The electron can then tunnel through the junction to the next emission region. The reverse process occurs for holes.

Figure 22:
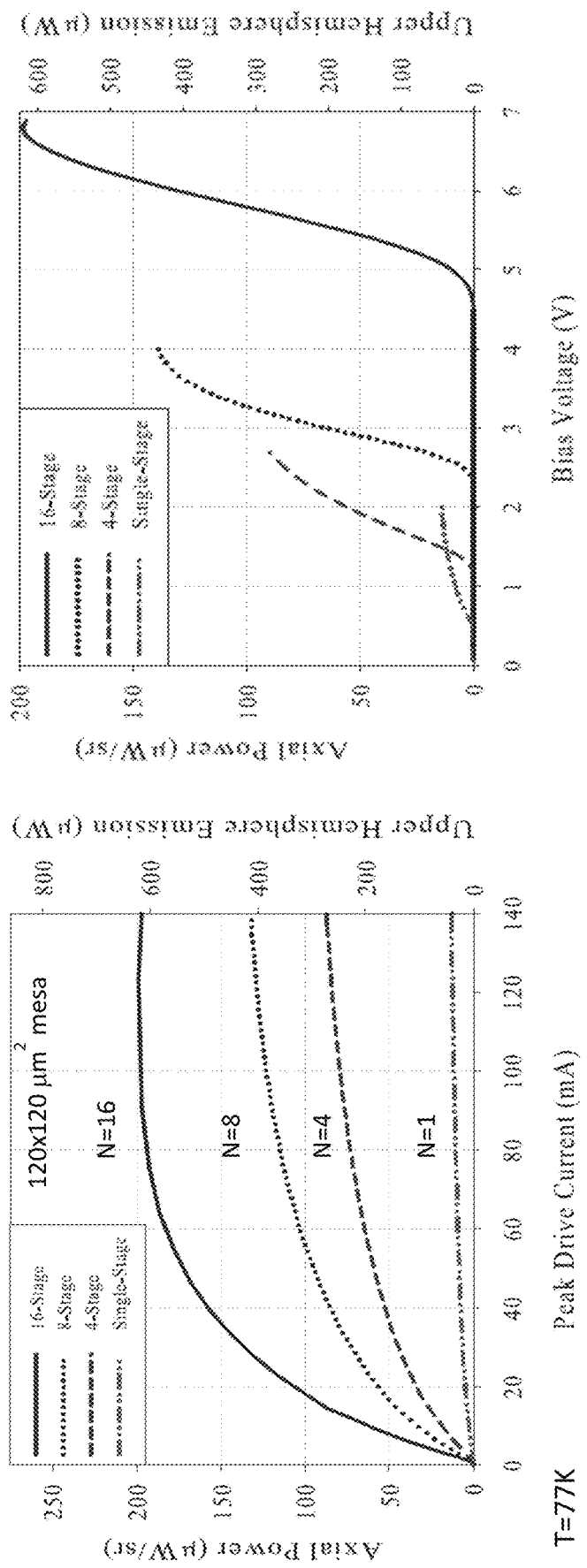
FIG. 22 graphically illustrates effects of cascaded SLEDs with a variable number of stages according to one embodiment of the present disclosure.

Turning to FIG. 22, the effect of peak drive currents on cascaded SLEDs is graphically evidenced. Accordingly, the MWIR (and LWIR) cascaded InAs/GaSb SLEDs exhibit high output power, and predicted scaling of output power with stages N.

All documents, patents, journal articles and other materials cited in the present application are incorporated herein by reference.

While the present disclosure has been disclosed with references to certain embodiments, numerous modification, alterations, and changes to the described embodiments are possible without departing from the sphere and scope of the present disclosure, as defined in the appended claims. Accordingly, it is intended that the present disclosure not be limited to the described embodiments, but that it has the full scope defined by the language of the following claims, and equivalents thereof.

What is claimed is:

1. A device, comprising:
   an emission device comprising:
   a top electrical contact;
   a top contact layer;
   a bottom injection layer;
   a bottom electrical contact; and
   an emission region disposed between the top contact layer and the bottom injection layer,
   wherein the emission region is configured with a first bandgap to emit light of a first wavelength,
   wherein the emission region comprises n cascading emission layers, where n is a whole and positive number, wherein the n cascading emission layers comprise at least one superlattice structure positioned between the bottom and top injection layers,
wherein the internal quantum efficiency (IQE) of the emission region is 15% or above at 77K; and
an encapsulant disposed over the emission device.

2. The device of claim 1, wherein the n cascading emission layers are adjacent to n−1 tunnel junctions between superlattice structures.

3. The device of claim 2, wherein the tunnel junctions comprise a thin film layer of n-AlInAsSb and a thin film layer of p-GaSb.

4. The device of claim 1, wherein the emission device comprises a three-dimensional trapezoidal pyramid shape.

5. The device of claim 4, wherein the device has approximately four times the light extraction efficiency over an encapsulated semiconductor chip alone.

6. The device of claim 4, wherein the device has approximately ten times the light extraction efficiency over a non-encapsulated semiconductor chip alone.

7. The device of claim 1 further comprising a substrate adjacent the bottom injection layer, wherein the substrate includes a top surface from where the light is emitted, wherein the top surface has a surface roughness proportional to a scale of a vacuum wavelength of the n emission layers over a refractive index of the substrate.

8. The device of claim 1, wherein the emission region comprises repeats of an electron well layer and a hole well layer.

9. The device of claim 1, wherein the superlattice structure comprises AlGaInSb/InAs.

10. The device of claim 1, wherein the superlattice structure comprises a four-layer superlattice.

11. The device of claim 10, wherein the four-layer superlattice comprises InAs/GaInSb/InAs/AlAsSb.

12. The device of claim 11, wherein the superlattice structure includes an electron well comprising InAs, a hole well comprising GaInSb and a barrier layer comprising AlAsSb.

13. The device of claim 1, wherein the at least one superlattice structure substantially eliminates valence band states to substantially suppress Auger scattering.

14. The device of claim 1, wherein the emission region comprises a first electron well layer, hole well layer, a second electron well layer, and a barrier layer.

15. The device of claim 14, wherein the barrier layer is defined as an aluminum-containing layer of a four-layer superlattice structure.

16. The device of claim 14, wherein the barrier layer comprises AlAsSb, the first electron well layer comprises InAs, the hole well layer comprises GaInSb and the second electron well layer comprises InAs.

17. The device of claim 16, wherein a total thickness of the barrier layer is about 18 Å.

18. The device of claim 1, wherein the device has a thickness of about 12-600 micrometers.

19. The device of claim 1, wherein the emission region has a thickness of about 20 nm to 5 μm.

20. The device of claim 1, wherein the internal quantum efficiency (IQE) of the emission region is above 58% at 77K.

21. The device of claim 1, wherein a peak internal quantum efficiency (IQE) of the superlattice structure is in a range of about 30% to 77% at 77K.

22. The device of claim 1, further comprising:
a heat sink with a first surface, wherein the emission device is disposed over a portion of the first surface, and the encapsulant is disposed over the emission device and the first surface.

23. A device, comprising:
an emission device; and
a bottom injection layer comprising an n-type anode layer,
wherein the emission device comprises a top and bottom electrical contact, a top and bottom injection layer, and an emission region disposed between the top and bottom injection layers, wherein the emission region comprises n cascading emission layers, wherein the n cascading emission layers are comprised of n−1 repeats of a first superlattice structure and a tunnel junction, followed by a final (nth) superlattice structure, wherein n is both a whole number and a positive number, wherein the emission region is configured with a first bandgap to emit radiation of a first wavelength, wherein the internal quantum efficiency (IQE) of the emission region is 15% or above at 77K.

24. The device of claim 23, wherein the bottom injection layer comprises a bottom contact layer and a tunnel junction adjacent the emission region.

25. The device of claim 23, wherein the superlattice structure comprises AlGaInSb/InAs.

26. The device of claim 23, wherein the superlattice structure comprises a four-layer superlattice.

27. The device of claim 26, wherein the four-layer superlattice comprises InAs/GaInSb/InAs/AlAsSb.

28. The device of claim 27, wherein the superlattice structure includes an electron well comprising InAs, a hole well comprising GaInSb and a barrier layer comprising AlAsSb.

29. The device of claim 23, wherein the superlattice structure substantially eliminates valence band states to substantially suppress Auger scattering.

30. The device of claim 23, wherein the emission device comprises a three-dimensional trapezoidal pyramid shape.

31. The device of claim 30, wherein the device has approximately four times the light extraction efficiency over an encapsulated semiconductor chip alone.

32. The device of claim 30, wherein the device has approximately ten times the light extraction efficiency over a non-encapsulated semiconductor chip alone.

33. The device of claim 23, wherein the internal quantum efficiency (IQE) of the emission region is above 58% at 77K.

34. The device of claim 23, wherein a peak internal quantum efficiency (IQE) of the superlattice structure is in a range of about 30% to 77% at 77K.

35. The device of claim 23, wherein the device has a thickness of about 12-600 micrometers.

36. The device of claim 23, wherein the emission region has a thickness of about 20 nm to 5 μm.

37. The device of claim 23, further comprising:
a heat sink with a first surface, wherein the emission device is disposed over a portion of the first surface.

38. A device, comprising:
an emission device, wherein the emission device comprises a top and bottom electrical contact, a top and bottom injection layer, and an emission region disposed between the top and bottom injection layers, wherein the emission region comprises n cascading emission layers, where n is a whole and positive number, wherein the n cascading emission layers comprise at least one superlattice structure, wherein the internal quantum efficiency (IQE) of the emission region is 15% or above at 77K.

39. The device of claim 38, wherein the device comprises n superlattice structures separated by tunnel junctions.

40. The device of claim 39, wherein the tunnel junctions substantially prevent electron leakage between the emission region prior to radiative recombination.

41. The device of claim 38, wherein the superlattice structure comprises a barrier layer, a first electron well layer, a hole well layer, and a second electron well layer.

42. The device of claim 40, wherein the barrier layer is defined as an aluminum-containing layer of a four-layer superlattice structure.

43. The device of claim 40, wherein the barrier layer comprises AlAsSb, the first electron well layer comprises InAs, the hole well layer comprises GaInSb and the second electron well layer comprises InAs.

44. The device of claim 38, wherein the superlattice structure comprises AlGaInSb/InAs.

45. The device of claim 38, wherein the superlattice structure comprises a four-layer superlattice.

46. The device of claim 45, wherein the four-layer superlattice comprises InAs/GaInSb/InAs/AlAsSb.

47. The device of claim 46, wherein the superlattice structure includes an electron well comprising InAs, a hole well comprising GaInSb and a barrier layer comprising AlAsSb.

48. The device of claim 38, wherein the at least one superlattice structure substantially eliminates valence band states to substantially suppress Auger scattering.

49. The device of claim 38, wherein the internal quantum efficiency (IQE) of the emission region is above 58% at 77K.

50. The device of claim 38, wherein a peak internal quantum efficiency (IQE) of the at least one superlattice structure is in a range of about 30% to 77% at 77K.

51. The device of claim 38, wherein the emission region has a thickness of about 20 nm to 5 µm.

52. The device of claim 38, wherein the device has a thickness of about 12-600 micrometers.

53. The device of claim 1, wherein the superlattice structure comprises a barrier layer, a first electron well layer, a hole well layer, and a second electron well layer.

54. The device of claim 23, wherein the superlattice structure comprises a barrier layer, a first electron well layer, a hole well layer, and a second electron well layer.

* * * * *